US011184000B2

(12) United States Patent
Kim et al.

(10) Patent No.: US 11,184,000 B2
(45) Date of Patent: Nov. 23, 2021

(54) ADAPTIVE VOLTAGE CLAMPS AND RELATED METHODS

(71) Applicant: Texas Instruments Incorporated, Dallas, TX (US)

(72) Inventors: Eung Jung Kim, Allen, TX (US); Sualp Aras, Dallas, TX (US); Abidur Rahman, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 134 days.

(21) Appl. No.: 16/001,551

(22) Filed: Jun. 6, 2018

(65) Prior Publication Data
US 2019/0214980 A1 Jul. 11, 2019

Related U.S. Application Data

(60) Provisional application No. 62/615,696, filed on Jan. 10, 2018.

(51) Int. Cl.
H03K 17/082 (2006.01)
H03K 17/14 (2006.01)
G01R 1/067 (2006.01)
H03K 17/0814 (2006.01)
H03K 17/16 (2006.01)
(Continued)

(52) U.S. Cl.
CPC ...... *H03K 17/0822* (2013.01); *G01R 1/06766* (2013.01); *G01R 31/2621* (2013.01); *H03K 17/08122* (2013.01); *H03K 17/08142* (2013.01); *H03K 17/145* (2013.01); *H03K 17/161* (2013.01)

(58) Field of Classification Search
CPC ....... H03K 17/08122; H03K 17/08142; H03K 17/0822; H03K 17/145; H03K 17/161; G01R 1/06766; G01R 31/2621; H02H 3/006; H02H 3/087
USPC ...................................................... 361/93.1
See application file for complete search history.

(56) References Cited

U.S. PATENT DOCUMENTS 5,530,612 A * 6/1996 Maloney ............. H01L 27/0259
361/56
5,610,790 A * 3/1997 Staab .................. H01L 27/0255
361/111
(Continued)

FOREIGN PATENT DOCUMENTS

DE 102005057765 A1 6/2007
JP 2014165848 A 9/2014
RU 2455131 C1 7/2012

OTHER PUBLICATIONS

Search Report for PCT Application No. PCT/US19/13080, mailing of international search report dated Apr. 25, 2019, 1 page.
(Continued)

*Primary Examiner* — Yemane Mehari
(74) *Attorney, Agent, or Firm* — Michelle F. Murray; Charles A. Brill; Frank D. Cimino

(57) ABSTRACT

Methods, apparatus, systems, and articles of manufacture providing adaptive voltage clamps are disclosed. An example apparatus includes a voltage clamp to clamp a drain-to-source voltage of a transistor to a first voltage when the drain-to-source voltage exceeds the first voltage, and a controller to generate a control signal to direct the voltage clamp to clamp the drain-to-source voltage to a second voltage different from the first voltage based on a fault signal.

20 Claims, 10 Drawing Sheets

(51) Int. Cl.
  *H03K 17/0812* (2006.01)
  *G01R 31/26* (2020.01)

(56) References Cited

U.S. PATENT DOCUMENTS

| | | | |
|---|---|---|---|
| 5,617,283 A * | 4/1997 | Krakauer | H02H 9/046 |
| | | | 361/111 |
| 6,870,400 B1 * | 3/2005 | Chong | G06F 1/24 |
| | | | 326/57 |
| 7,531,263 B2 | 5/2009 | Liu et al. | |
| 9,531,263 B2 * | 12/2016 | Hayashi | H03K 17/18 |
| 2002/0079944 A1 | 6/2002 | Sander | |
| 2004/0075103 A1 | 4/2004 | Topp et al. | |
| 2010/0327777 A1 * | 12/2010 | Huang | H05B 45/46 |
| | | | 315/309 |
| 2014/0203860 A1 * | 7/2014 | Senda | H03K 17/0828 |
| | | | 327/381 |
| 2017/0346274 A1 | 11/2017 | Nakahara et al. | |
| 2019/0074826 A1 * | 3/2019 | Tran | H03K 17/0822 |
| 2020/0021284 A1 * | 1/2020 | Thalheim | H03K 17/0822 |
| 2020/0076425 A1 * | 3/2020 | Garg | H03K 17/6871 |

OTHER PUBLICATIONS

"Written Opinion," PCT Application No. PCT/US2019/013080, dated Apr. 17, 2019, 5 pages.
"Extended European Search Report," European Application No. 19738706.1, dated Feb. 9, 2021, 9 pages.

* cited by examiner

ADAPTIVE VOLTAGE CLAMPS AND RELATED METHODS

RELATED APPLICATION

This patent arises from an application claiming the benefit of U.S. Provisional Patent Application Ser. No. 62/615,696, which was filed on Jan. 10, 2018. U.S. Provisional Patent Application Ser. No. 62/615,696 is hereby incorporated herein by reference in its entirety. Priority to U.S. Provisional Patent Application Ser. No. 62/615,696 is hereby claimed.

FIELD OF THE DISCLOSURE

This disclosure relates generally to power switches and, more particularly, to adaptive voltage clamps and related methods.

BACKGROUND

For a power metal oxide semiconductor field-effect transistor (MOSFET) to operate within a safe operating area (SOA), its drain-source current and drain-source voltage must stay within the SOA boundary when the power MOSFET accumulates energy from an applied voltage and current. Typically, power MOSFETs rely on thermal protection when they enter a thermal instability region due to the applied voltage and current exceeding safe operating levels. The power MOSFETs must be turned off before the power MOSFETs encounter a thermal runaway problem resulting in switching inefficiencies.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Figure 1:
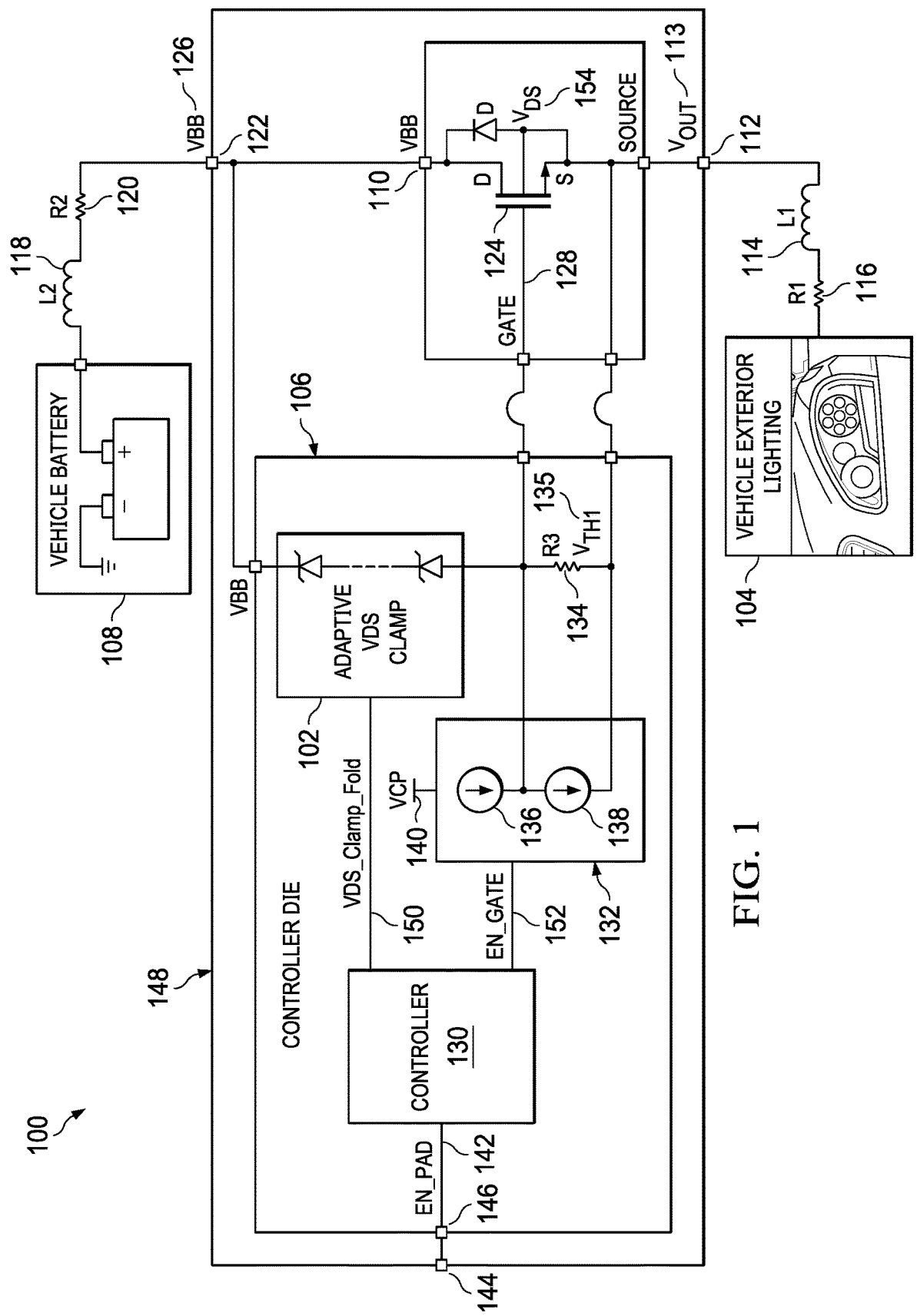
FIG. 1 is a schematic illustration of an example power switching system including an example adaptive drain-to-source voltage ($V_{DS}$) clamp to implement the examples disclosed herein.

Power MOSFETs are commonly used power devices due to their fast-switching speed, low gate drive power, and superior paralleling capability. For a power MOSFET to operate within a SOA, its drain-source current ($I_{DS}$) and drain-source voltage ($V_{DS}$) must stay within the SOA boundary when the power MOSFET accumulates energy from an applied voltage and current. Typically, a power MOSFET included in an integrated circuit (IC) package operates safely when limited to a maximum current flowing between the source and drain (e.g., $I_{DSS}$) and/or a maximum $BV_{DSS}$.

In some examples, such as automotive applications (e.g., automotive lighting applications), limiting the $V_{DS}$ and the $I_{DS}$ is difficult due to supply voltage surges during load dump. A load dump can occur when a load to which a power source is delivering power to is abruptly disconnected. For example, in an automotive application, when a vehicle battery is disconnected while being charged by a vehicle alternator, other loads connected to the vehicle alternator see a surge in supply voltage (e.g., 60 V, 80 V, 100 V, etc.) and/or a substantially high transient current (e.g., 80 amps (A), 90 A, 100 A, etc.).

Turning on a device such as a light bulb (e.g., in cold weather) becomes problematic because of its high in-rush current. For example, to drive a vehicle light bulb at −40 degrees Centigrade, a 65-Watt (W) bulb can require approximately 80 Amps (A) to turn on within a specified time period. During load dump, a drain-to-source clamp must not clamp supply voltage due to the high voltage and relatively long duration during which the high voltage persists. However, in such examples, the power accumulation on the power MOSFET can exceed the SOA due to the high $V_{DS}$ and the corresponding $I_{DS}$ during the time duration.

Similarly, for an automotive lighting application, an in-rush current of a light indicator (e.g., a headlight light bulb) at cold temperatures can be as high as a current associated with a short-circuit condition. To prevent activation of short-circuit mitigation measures, the current limit of the high-side switch must be set at a fixed level higher than the light indicator in-rush current to energize and turn on the light indicator within a desired turn-on time specification limit.

In prior examples, significant silicon area overhead in power MOSFETs is needed to design a power switching circuit to handle both a current limit that is higher than the light indicator in-rush current and a drain-source clamp voltage that is higher than the load-dump supply voltage surge. For example, previous implementations used a fixed drain-source clamp voltage to ensure that one or more power MOSFETs operated within the SOA boundary.

Examples disclosed herein provide adaptive or dynamic adjustments to drain-source voltage clamp levels in power switching systems. In some disclosed examples, an adaptive voltage clamp controller dynamically controls a clamp voltage ($V_C$) (e.g., a clamp voltage level, a clamp voltage threshold, etc.) for a drain-source voltage ($V_{DS}$) of one or more MOSFETs based on an operating condition of the one or more MOSFETs. In some disclosed examples, the adaptive voltage clamp controller maintains a substantially high (e.g., 40V, 45V, 50V, etc.) clamp voltage during a non-fault condition, or a non-fault regular load condition.

In some disclosed examples, the adaptive voltage clamp controller reduces the clamp voltage from a normal operation state to a folded state (e.g., 25V, 30V, 35V, etc.) when the one or more MOSFETs are experiencing a fault condition. For example, a MOSFET providing power to a device electrically coupled to the power switching system may experience a fault condition and quickly turn off during a thermal shutdown and/or when the MOSFET exceeds a current limit (e.g., activating short-circuit protection measures). By lowering the clamp voltage during the fault condition, the peak power dissipation in one or more power MOSFETs can be reduced to improve reliability and/or otherwise extend an operating lifetime of the power MOSFETs.

FIG. 1 is a schematic illustration of an example power switching system 100 including an example voltage clamp 102, or an example adaptive drain-source voltage ($V_{DS}$) clamp 102, to dynamically control a $V_{DS}$ clamp level, or a clamp voltage, based on an operating condition of an example transistor 124 providing power to an example device 104. The adaptive $V_{DS}$ clamp 102 is an improvement over prior fixed $V_{DS}$ clamps and example implementations of the adaptive $V_{DS}$ clamp 102 are described below. In FIG. 1, the power switching system 100 includes an example controller die 106 to determine when to provide power (e.g., a current, a voltage, etc.) from an example power source 108 to the device 104 via an example power switching die 110. In FIG. 1, the controller die 106 is an integrated circuit (IC) chip including one or more electrical circuits. Alternatively, the controller die 106 may be implemented using hardware logic, machine readable instructions, hardware implemented state machines, etc., and/or any combination thereof.

In FIG. 1, the device 104 is a light indicator (e.g., a halogen bulb, a light-emitting diode, a xenon bulb, etc.) of a vehicle (e.g., an aircraft, an automobile, a marine vehicle, etc.). For example, the device 104 can be a headlight of an automobile corresponding to vehicle exterior lighting. Alternatively, the device 104 may be any other device requiring power from a switchable power source. The device 104 of FIG. 1 is electrically coupled to the power switching die 110 at an output node 112 to receive an output voltage ($V_{OUT}$) 113. In FIG. 1, the power switching die 110 is coupled to the output node 112 via a first example inductor (L1) 114 and a first example resistor (R1) 116. Although the first inductor 114 and the first resistor 116 are depicted as separate elements, they are not physical elements, but a representation of an equivalent inductance and resistance of the coupling between the device 104 and the power switching die 110 (e.g., wiring inductance and resistance).

In FIG. 1, the power switching die 110 is electrically coupled to the power source 108 via a second example inductor (L2) 118 and a second example resistor (R2) 120 at a power input node 122. The power switching die 110 includes the example transistor 124 to alternately provide an example supply voltage ($V_{BB}$) (e.g., a source voltage) 126 to the device 104 based on an example gate voltage 128 of the transistor 124. In FIG. 1, the power source 108 is a vehicle battery. Alternatively, the power source 108 may be any other supply of electrical power. Although the second inductor 118 and the second resistor 120 are depicted as separate elements, they are not physical elements, but a representation of an equivalent inductance and resistance of the coupling between the power source 108 and the power switching die 110.

In FIG. 1, the transistor 124 is a first transistor 124. The first transistor 124 of FIG. 1 is an N-channel MOSFET. For example, the first transistor 124 can be a power transistor. Alternatively, the power switching die 110 may be implemented utilizing more than one transistor 124. Alternatively, the power switching die 110 may be implemented utilizing one or more P-channel MOSFETs.

In FIG. 1, the controller die 106 includes the $V_{DS}$ clamp 102, an example controller 130, an example gate driver 132, and a third example resistor (R3) 134. In FIG. 1, a first example threshold voltage ($V_{TH1}$) 135 builds up across the third resistor 134 to turn on the first transistor 124. In FIG. 1, the gate driver 132 includes an example gate-pull up driver 136 and an example gate-pull down driver 138. In FIG. 1, each of the gate-pull up driver 136 and the gate-pull down driver 138 can correspond to one or more resistors. Alternatively, gate-pull up driver 136, the gate-pull down driver 138, and/or, the gate driver 132 may be implemented using hardware logic, machine readable instructions, hardware implemented state machines, etc., and/or any combination thereof.

In some examples, the gate-pull up driver 136 pulls the gate voltage 128 up to an example pull-up voltage ($V_{CP}$) 140. In other examples, the gate-pull down driver 138 pulls the gate voltage 128 down to the supply voltage 126. Alternatively, the controller die 106 may include more than one of the $V_{DS}$ clamp 102, the controller 130, and/or the gate driver 132. In FIG. 1, the controller 130 is an IC chip including one or more electrical circuits. Alternatively, the controller 130 may be implemented using hardware logic, machine readable instructions, hardware implemented state machines, etc., and/or any combination thereof.

The controller 130 of FIG. 1 obtains an example enable signal (EN_PAD) 142 from a first example input node 144 at a second example input node 146, or a controller die input node 146. In some examples, a high value of the enable signal 142 triggers the controller 130 to initialize the power switching system 100. In some examples, a low value of the enable signal 142 triggers the controller 130 to idle, pause, and/or otherwise suspend an operation of the power switching system 100.

In FIG. 1, the first input node 144 is electrically coupled to the second input node 146 on an example circuit interface 148. For example, the second input node 146 can be electrically coupled to one or more electrical circuits, controllers, and/or hardware disposed on the circuit interface 148. In FIG. 1, the circuit interface 148 is a silicon substrate. Alternatively, the circuit interface 148 may be a gallium arsenide substrate or any other type of semiconductor substrate. In FIG. 1, the circuit interface 148 is depicted as a separation between different circuit or electrical interfaces. In FIG. 1, the output node 112, the power input node 122, and the first input node 144 are not directly coupled to each other. For example, the output node 112, the power input node 122, and the first input node 144 are not electrically shorted to each other. In some examples, the circuit interface 148 is a multi-chip module (MCM) package including the controller die 106 and/or the power switching die 110.

In operation, the controller 130 generates a first example control signal (VDS_Clamp_Fold) 150 and a second example control signal (EN_GATE) 152 based on a condition of the first transistor 124. For example, the controller 130 can obtain information associated with an operating condition of the first transistor 124 (e.g., an example fault signal 302 described in connection with FIGS. 3-4). For example, the controller 130 can generate a first value of the first control signal 150 and a second value of the second control signal 152 when the first transistor 124 is in the non-fault regular load condition. For example, the first value of the first control signal 150 can control the $V_{DS}$ clamp 102 to clamp an example $V_{DS}$ 154 of the first transistor 124 to a first voltage (e.g., a first threshold, a first voltage clamp level, a first voltage threshold, etc.) to prevent the $V_{DS}$ clamp 102 from prematurely clamping the supply voltage 126. In the illustrated example of FIG. 1, Vps 154 is with respect to the drain of the first transistor 124 and a body of the first transistor 124. In the example of FIG. 1, the body of the first transistor 124 is coupled to the drain of the first transistor 124 through a body diode D. The second value of the second control signal 152 can control the gate driver 132 to activate and/or otherwise enable the gate-pull up driver 136 and deactivate and/or otherwise disable the gate-pull down driver 138 to switch on the first transistor 124.

In some examples, the controller 130 generates a third value of the first control signal 150 and a fourth value of the second control signal 152 when the first transistor 124 is in the fault condition. For example, the third value of the first control signal 150 can control the $V_{DS}$ clamp 102 to clamp the $V_{DS}$ 154 to a second voltage (e.g., a second threshold, a second voltage clamp level, a second voltage threshold, etc.) to enable the $V_{DS}$ clamp 102 to clamp $V_{OUT}$ 113 when the $V_{DS}$ 154 of the first transistor 124 extends to and/or otherwise operates at an unsafe operating level. The fourth value of the second control signal 152 can control the gate driver 132 to disable the gate-pull up driver 136 and activate the gate-pull down driver 138 to switch off the first transistor 124.

While an example manner of implementing the controller die 106 and the power switching die 110 is illustrated in FIG. 1, one or more of the elements, processes, and/or devices illustrated in FIG. 1 may be combined, divided, re-arranged, omitted, eliminated, and/or implemented in any other way. Further, the example $V_{DS}$ clamp 102, the example controller 130, the example gate driver 132, and/or, more generally, the example controller die 106 of FIG. 1 and/or the example transistor 124, and/or, more generally the example power switching die 110 of FIG. 1 may be implemented by hardware, software, firmware, and/or any combination of hardware, software, and/or firmware. Thus, for example, any of the example $V_{DS}$ clamp 102, the example controller 130, the example gate driver 132, and/or, more generally, the example controller die 106 and/or the first transistor 124, and/or, more generally, the example power switching die 110 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example, $V_{DS}$ clamp 102, the example transistor 124, the example controller 130, and/or the example gate driver 132, is/are hereby expressly defined to include a non-transitory computer readable storage device or storage disk such as a memory, a digital versatile disk (DVD), a compact disk (CD), a Blu-ray disk, etc., including the software and/or firmware. Further still, the example controller die 106 and/or the power switching die 110 may include one or more elements, processes, and/or devices in addition to, or instead of, those illustrated in FIG. 1, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 2:
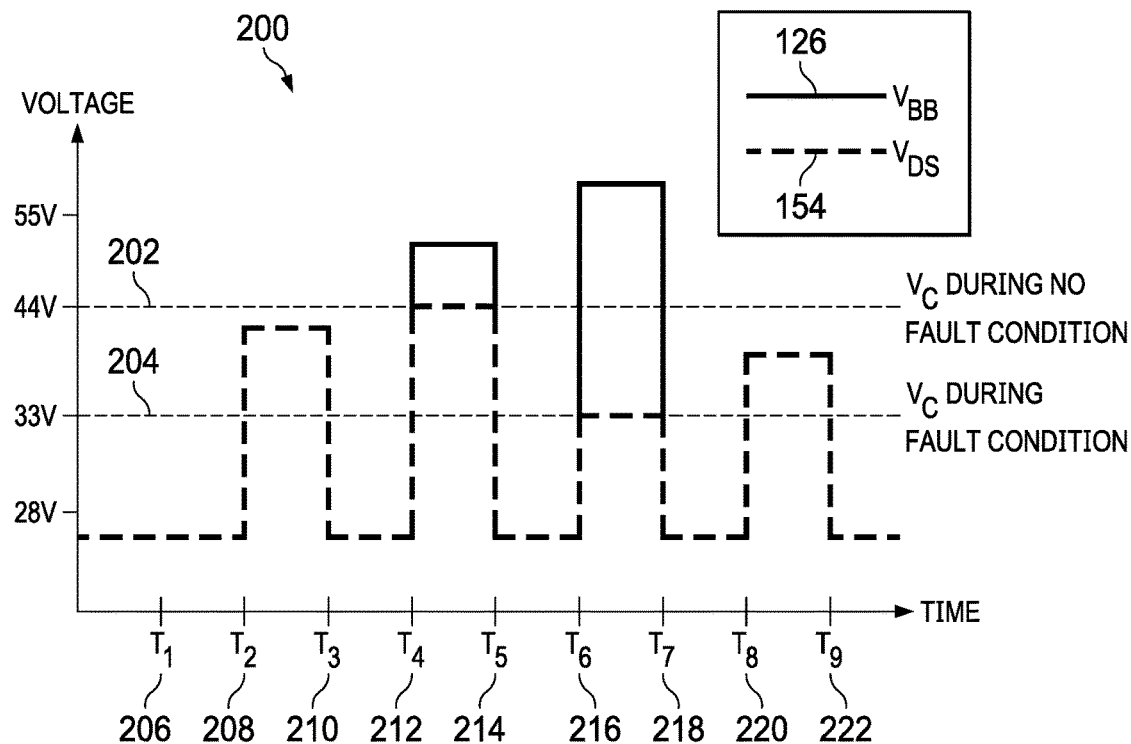
FIG. 2 is an example graph depicting example operations of the $V_{DS}$ clamp of FIG. 1.

FIG. 2 is an example graph 200 depicting example operations of the $V_{DS}$ clamp 102 of FIG. 1. In FIG. 2, the graph 200 depicts the supply voltage ($V_{BB}$) 126 and the $V_{DS}$ 154 with respect to time. In FIG. 2, the supply voltage 126 is depicted using a solid line and the $V_{DS}$ 154 is depicted using a solid line with cross-hatches. In FIG. 2, the graph 200 illustrates the $V_C$ of the $V_{DS}$ clamp 102 being adjusted from a first example threshold 202, or a first example clamp voltage 202, to a second example threshold 204, or a second example clamp voltage 204, based on a condition of the first transistor 124.

In the illustrated example of FIG. 2, at a first time ($T_1$) 206, the supply voltage 126 and the $BV_{DSS}$ are approximately 24 V during a non-fault regular load operation of the first transistor 124. In FIG. 2, at the first time 206, the $V_C$ of the $V_{DS}$ clamp 102 is at the first threshold 202. In FIG. 2, the first threshold 202 is 44 V. Alternatively, the first threshold 202 may be any other voltage.

At a second time ($T_2$) 208, the $V_{DS}$ 154 is experiencing a voltage surge (e.g., a load dump). At the second time 208, the controller 130 of FIG. 1 does not adjust the $V_{DS}$ clamp 102 to the second threshold because the first transistor 124 is not experiencing a fault condition. In prior implementations that used a fixed $V_{DS}$ clamp with a $V_C$ of 40 V, the supply voltage 126 would be clamped to 40 V and hamper the operation of the first transistor 124. In FIG. 2, although the $V_{DS}$ 154 has surged to approximately 42 V, the $V_{DS}$ clamp 102 does not clamp the $V_{DS}$ 154 as the $V_C$ is at the first threshold 202 of 44 V and, thus, the $V_{DS}$ 154 correlates to the supply voltage 126 from the second time 208 until a third time ($T_3$) 210 when the $V_{DS}$ surge subsides.

In the illustrated example of FIG. 2, the $V_{DS}$ 154 surges to approximately 49 V at a fourth time ($T_4$) 212. At the fourth time 212, the first transistor 124 is not experiencing a fault condition so the controller 130 does not generate the first control signal 150 to adjust the $V_C$ of the $V_{DS}$ clamp 102. From the fourth time 212 until a fifth time ($T_5$) 214, the $V_{DS}$ clamp 102 clamps the $V_{DS}$ 154 from 49 V to the first threshold of 44 V.

In FIG. 2, the first transistor 124 experiences a fault condition at a sixth time ($T_6$) 216. In response to the controller 130 determining the fault condition, the controller 130 generates the first control signal 150 to adjust the $V_{DS}$ clamp 102 from the first threshold 202 to the second threshold 204. In FIG. 2, the $V_{DS}$ clamp 102 clamps the $V_{DS}$ 154 of approximately 60 V to the second threshold 204 of 33 V. The controller 130 generates the first control signal 150 for a period of time defined by a $V_{DS}$ folding timer. The $V_{DS}$ folding timer represents a quantity of time for the output current to the device 104 to dissipate to approximately 0 A.

In the illustrated example of FIG. 2, the controller 130 generates the first control signal 150 to adjust the $V_C$ of the $V_{DS}$ clamp 102 from the second threshold 204 back to the first threshold 202 after the $V_{DS}$ folding timer expires. For example, the $V_{DS}$ folding timer can expire at a seventh time ($T_7$) 218 or any time before an eighth time ($T_8$) 220. In FIG. 2, the supply voltage 126 surges to approximately 40 V at the eighth time 220. At the eighth time 220, the first transistor 124 is not experiencing a fault condition. From the eighth time 220 until a ninth time ($T_9$) 222, the $V_{DS}$ clamp 102 does not clamp the $V_{DS}$ 154 as the $V_C$ of the $V_{DS}$ clamp 102 returned to the first threshold 202 when the $V_{DS}$ folding timer expired.

Figure 3:
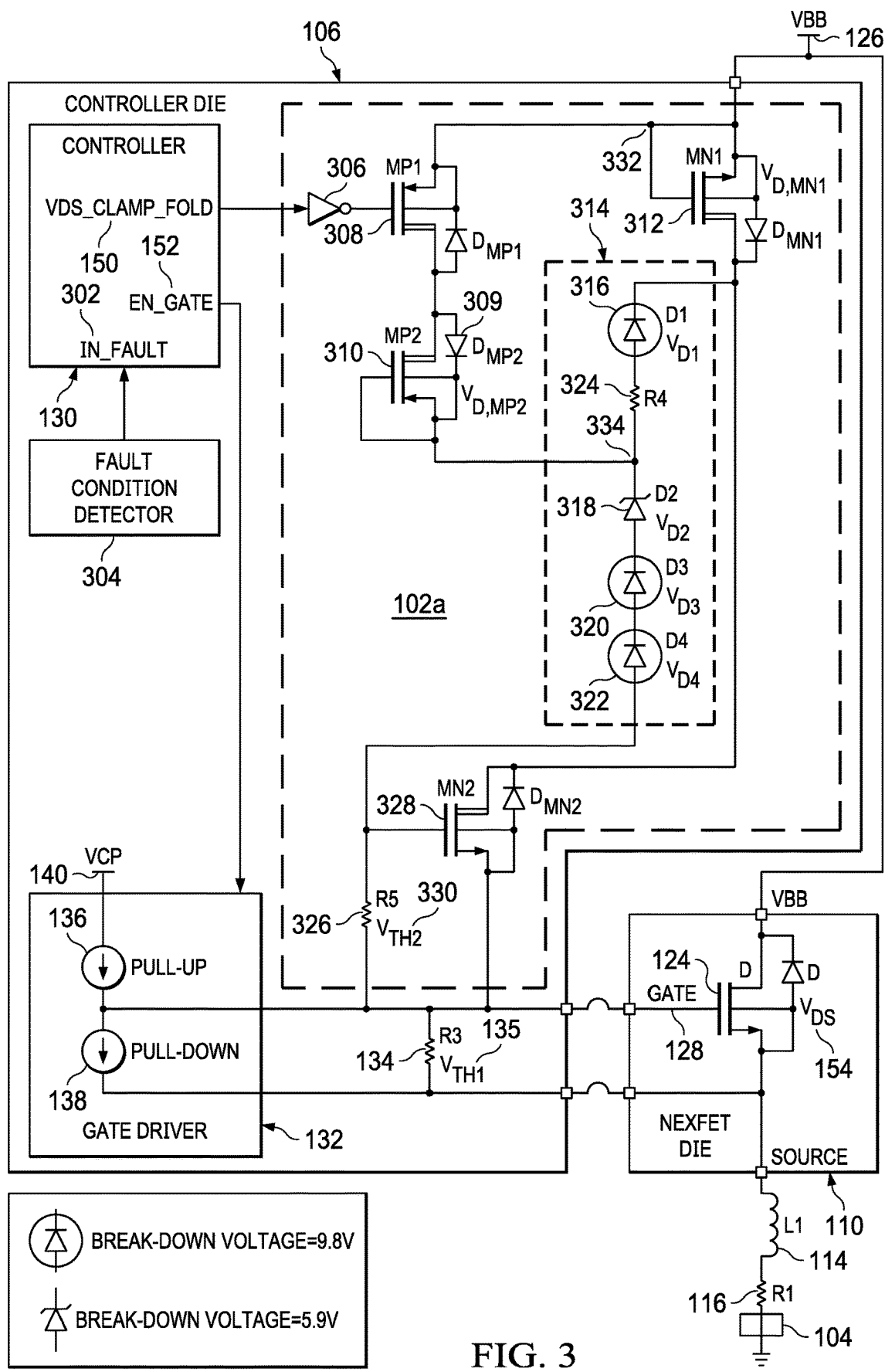
FIG. 3 is a schematic illustration of an example implementation of the adaptive $V_{DS}$ clamp of FIG. 1.

FIG. 3 is a schematic illustration of an example implementation of the $V_{DS}$ clamp 102 of FIG. 1. The $V_{DS}$ clamp 102a of FIG. 3 corresponds to the $V_{DS}$ clamp 102 of FIG. 1. In FIG. 3, the controller 130 of FIG. 1 controls the $V_C$ of the $V_{DS}$ clamp 102a based on the example fault signal 302 (IN FAULT) generated by an example fault condition detector 304. In FIG. 3, the fault condition detector 304 is a current limit circuit and/or a thermal protection circuit. For example, a current limit circuit can detect whether an output current is higher than a current threshold. A thermal protection circuit can detect whether a temperature of a die (e.g., the power switching die 110 of FIG. 1) is higher than a temperature threshold. In some examples, the current limit circuit and/or the thermal protection circuit is integrated with and/or otherwise included in the controller die 106 of FIG. 1. In other examples, the current limit circuit and/or the thermal protection circuit is not included in the controller die 106. In some examples, the fault condition detector 304 generates a high value for the fault signal 302 when a fault condition is detected for the first transistor 124. For example, the fault condition detector 304 can generate the high value for the fault signal 302 when the first transistor 124 exceeds a current limit and/or experiences a thermal shutdown.

In the illustrated example of FIG. 3, the controller 130 generates the first control signal 150 based on the fault signal 302. In some examples, the controller 130 generates the first control signal 150 to have a low value, or a first voltage (e.g., a digital 0, a logic value of 0, a signal of approximately 0 V, etc.), when the fault signal 302 does not indicate a fault condition associated with the first transistor 124. In some examples, the controller 130 generates the first control signal 150 to have a high value, or a second voltage (e.g., a digital 1, a logic value of 1, a signal of approximately 5 V, etc.), when the fault signal 302 indicates a fault condition associated with the first transistor 124.

In FIG. 3, the $V_{DS}$ clamp 102a includes an example inverter 306 coupled to the controller 130 to receive and invert the first control signal 150. For example, the inverter 306 can invert the first voltage to the second voltage or invert the second voltage to the first voltage. In FIG. 3, the inverter 306 is coupled to a gate terminal of a second example transistor (MP1) 308. MP1 308 of FIG. 3 is coupled to a third example transistor (MP2) 310 in a back-to-back diode configuration. For example, a drain of MP1 308 is coupled to a drain of MP2 310, a body diode of MP1 308 is coupled to the drain of MP2 310, the body diode of MP1 308 is coupled to a body diode of MP2 310, etc. In FIG. 3, MP2 310 is always turned off as MP2 310 provides a blocking diode for MP1 308. For example, when MP1 308 is turned on, a current will flow through an example body diode 309 of MP2 310.

In FIG. 3, MP1 308 and MP2 310 provide a foldback of the $V_{DS}$ clamp 102a by reducing the $V_{DS}$ clamp voltage level by shorting a first example node 332 and a second example node 334 as described in further detail below. In FIG. 3, MP1 308 and MP2 310 are P-channel MOSFETs. In FIG. 3, MP1 308 and MP2 310 are substantially similar to each other (e.g., MP1 308 and MP2 310 are the same type, have the same electrical and/or mechanical parameters, structures, etc., within a tolerance). Alternatively, MP1 308 and MP2 310 may be different from each other.

During a non-fault regular load operation of the first transistor 124, the controller 130 generates the first voltage for the first control signal 150. The inverter 306 inverts the first voltage to the second voltage to turn on MP1 308. In FIG. 3, a fourth example transistor (MN1) 312 is coupled to the supply voltage 126, MP1 308, and a series-connected diode stack 314. In FIG. 3, MN1 312 is an N-channel MOSFET. Alternatively, the $V_{DS}$ clamp 102a may be implemented utilizing a P-channel MOSFET in place of MN1 312. In FIG. 3, a gate of MN1 312 is coupled to the supply voltage 126 and, thus, is always turned off. In FIG. 3, MN1 312 provides a blocking diode (e.g., the body diode of MN1 ($V_{D,MN1}$)) for normal turn on in which the gate voltage 128 of the first transistor 124 goes above the supply voltage 126.

In FIG. 3, the series-connected diode stack 314 includes a first example diode (D1) 316, a second example diode (D2) 318, a third example diode (D3) 320, and a fourth example diode (D4) 322. In some examples, the diode stack 314 includes two or more diodes. A fourth example resistor (R4) 324 is coupled between the first example diode 316 and the second example diode 318. In FIG. 3, the first, third, and fourth diodes 316, 318, 322 each have a break-down voltage of approximately 9.8 V. Alternatively, the first, third, and fourth diodes 316, 318, 322 may have different break-down voltages and/or may have different break-down voltages from each other. The second diode 318 of FIG. 3 is a Zener diode that has a break-down voltage of approximately 5.9 V. Alternatively, the second diode 318 may have a different break-down voltage.

In the illustrated example of FIG. 3, in response to break down of the series-connected diode stack 314, a current flows from the supply voltage 126 through $V_{D,MN1}$ of the MN1 312, the diode stack 314, and a fifth example resistor (R5) 326. In FIG. 3, the current is high enough to turn on a fifth example transistor (MN2) 328 by inducing a gate voltage of MN2 328 to be greater than a second example threshold voltage ($V_{TH2}$) 330 across the fifth resistor 326. When MN2 328 turns on, MN1 312 and MN2 328 form a current path to facilitate a current to flow from the supply voltage 126 to the gate of the first transistor 124 of FIG. 1. The current builds up the first threshold voltage 135 across the third resistor 134 of FIG. 1 that turns on the first transistor 124 of FIG. 1. In the illustrated example of FIG. 3, MP1 308 has a body diode $D_{MP1}$ between a body of MP1 308 and a drain of MP1 308. MP2 310 has a body diode $D_{MP2}$ between a body of MP2 310 and a drain of MP2 310. MN1 312 has a body diode $D_{DM1}$ between a body of MN1 312 and a drain of MN1 312. MN2 328 has a body diode $D_{MN2}$ between a body of MN2 328 and a drain of MN2 328.

In FIG. 3, the $V_{DS}$ 154 of the first transistor 124 is clamped to the first voltage threshold 202 of FIG. 2 during a non-fault regular load condition (e.g., the fault signal 302 is a low value, the fault signal 302 indicates no fault condition, etc.). In FIG. 3, the $V_C$ of the $V_{DS}$ clamp 102a when the first transistor 124 is in a non-fault regular load condition can be approximated as described below in Equation (1):

$$V_C = V_{D,MN1} + V_{D1} + V_{D2} + V_{D3} + V_{D4} + V_{TH1} + V_{TH2} + R4 * \left(\frac{V_{TH2}}{R5}\right) \quad \text{Equation (1)}$$

In the example of Equation (1) above, $V_{D,MN1}$ refers to the forward-bias body diode voltage of MN1 312 and $V_{D1}$, $V_{D2}$, $V_{D3}$, and $V_{D4}$ refer to the reverse breakdown voltages of the first diode 316, the second diode 318, the third diode 320, and the fourth diode 322, respectively. In the example of Equation (1) above, $V_{TH1}$ refers to the first threshold voltage 135, $V_{TH2}$ refers to the second threshold voltage 330, R4 refers to the resistance of the fourth resistor 324, and R5 refers to the resistance of the fifth resistor 326. In the example of FIG. 3 during a non-fault regular load operation of the first transistor 124, the example of Equation (1) can be evaluated to approximately 44 V.

In some examples, when the first transistor 124 is in a fault condition, the controller 130 generates the second voltage for the first control signal 150 and the inverter 306 inverts the second voltage to the first voltage. In FIG. 3, the first voltage turns on MP1 308 by pulling a gate of MP1 308 low. When MP1 308 is enabled, a first example node 332 coupled to the supply voltage 126 is shunted to a second example node 334. In FIG. 3, the second node 334 is coupled to MP2 310, a cathode of the second diode 318, and the fourth resistor 324. In response to enabling MP1 308, MP1 308 and MP2 310 provide a current path from the supply voltage 126 to the cathode of the second diode 318 at the second node 334. The current path to the second diode 318 generates an early-break down of the $V_{DS}$ clamp 102a compared to when the first transistor 124 is in the non-fault regular load condition.

In FIG. 3, the $V_C$ of the $V_{DS}$ clamp 102a during a fault condition can be approximated as described below in Equation (2):

$$V_C = V_{D,MP2} + V_{D2} + V_{D3} + V_{D4} + V_{TH1} + V_{TH2} \quad \text{Equation (2)}$$

In the example of Equation (2) above, $V_{D,MP2}$ refers to the forward-bias body diode voltage of MP2 310. In the example of FIG. 3 during a fault condition of the first transistor 124, the example of Equation (2) can be evaluated to approximately 33 V.

Figure 4:
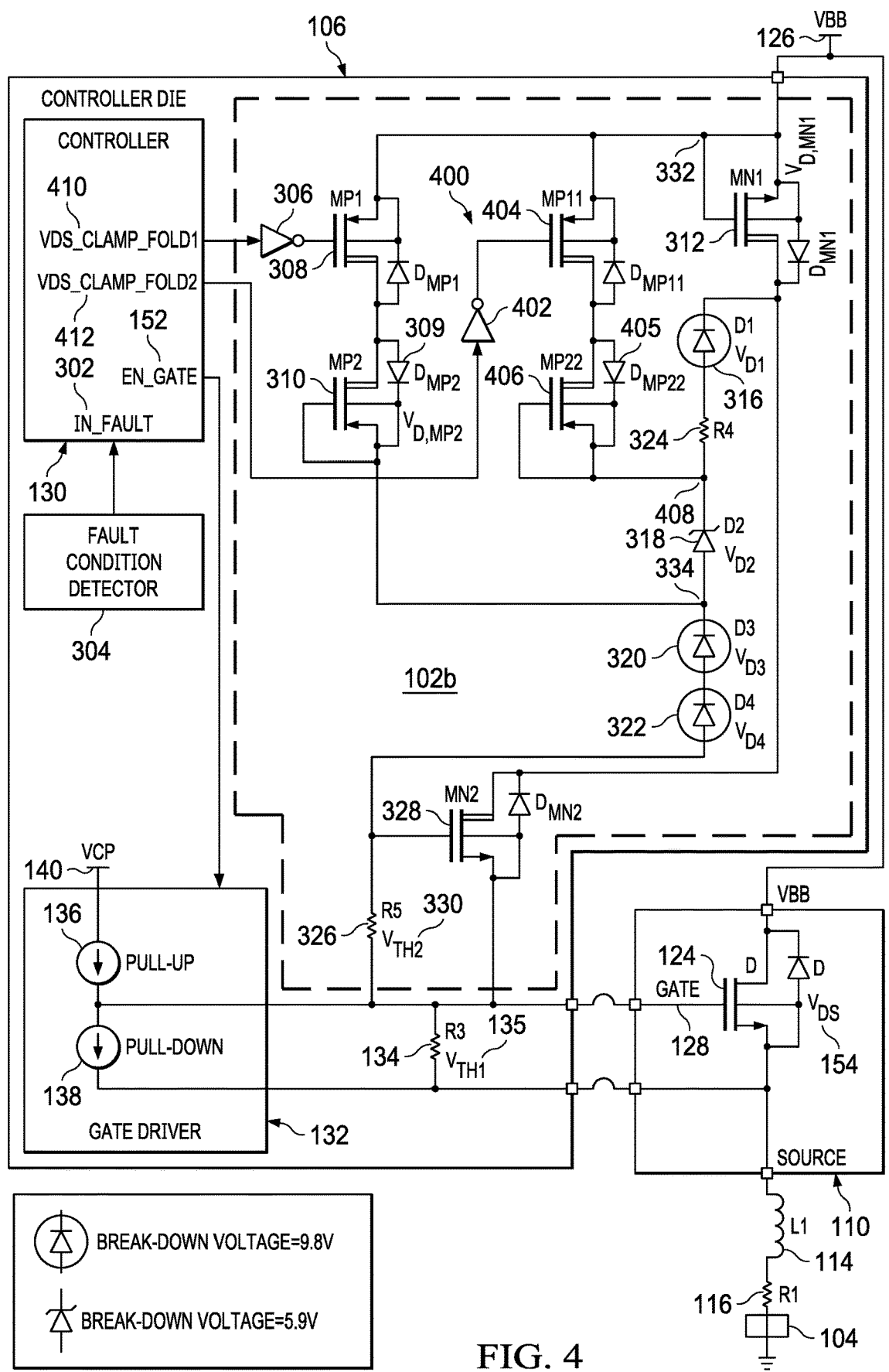
FIG. 4 is a schematic illustration of an alternative example implementation of the adaptive $V_{DS}$ clamp of FIG. 1.

FIG. 4 is a schematic illustration of an alternative example implementation of the adaptive $V_{DS}$ clamp 102 of FIG. 1 including a two-level clamp control structure 400. The $V_{DS}$ clamp 102b of FIG. 4 corresponds to the $V_{DS}$ clamp 102 of FIG. 1. In FIG. 4, the $V_{DS}$ clamp 102b includes the inverter 306 of FIG. 3, or a first inverter 306, MP1 308, and MP2 310 of FIG. 3. The $V_{DS}$ clamp 102b of FIG. 4 includes a second inverter 402 coupled to the controller 130 and a sixth example transistor (MP11) 404. In FIG. 4, MP11 404 is coupled to a seventh example transistor (MP22) 406. In FIG. 4, MP11 404 is coupled to the supply voltage 126 via the first node 332. MP22 406 of FIG. 4 is coupled to the cathode of the second diode 318 and the fourth resistor 324 at a third example node 408. In FIG. 4, MP22 406 is always turned off as MP22 406 provides a blocking diode for MP11 404. For example, when MP11 404 is turned on, a current will flow through an example body diode 405 of MP22 406. MP11 404 has a body diode $D_{MP11}$ between a body of MP11 404 and a drain of MP11 404. MP22 406 has a body diode $DMP_{MP22}$ between a body of MP22 406 and a drain of MP22 406.

In FIG. 4, MP11 404 and MP22 406 are P-channel MOSFETs. Alternatively, the $V_{DS}$ clamp 102b may be implemented utilizing N-channel MOSFETs in place of MP11 404 and MP22 406. In FIG. 4, MP11 404 and MP22 406 are substantially similar to each other (e.g., MP11 404 and MP22 406 are the same type, have the same electrical and/or mechanical parameters, structures, etc., within a tolerance). Alternatively, MP11 404 and MP22 406 may be different from each other. In FIG. 4, MP11 404 and MP22 406 are substantially similar to MP1 308 and MP2 310. Alternatively, MP11 404 and MP22 406 may be different from MP1 308 and MP2 310.

In FIG. 4, the controller 130 of FIG. 1 can adjust $V_C$ of the $V_{DS}$ clamp 102b to different clamp voltages based on at least one of the second control signal 152, the fault signal 302, a first example clamp control signal (VDS_CLAMP_FOLD1) 410, or a second example clamp control signal (VDS_CLAMP_FOLD2) 412. The first clamp control signal 410 can correspond to the first control signal 150 of FIG. 1. In some examples, the controller 130 adjusts $V_C$ of the $V_{DS}$ clamp 102b to a first clamp voltage, or a first threshold, by generating low values for and/or otherwise disabling the first and second clamp control signals 410, 412 during a non-fault regular load operation of the first transistor 124. The controller 130 can determine the non-fault regular load condition of the first transistor 124 based on the fault signal 302. For example, the controller 130 can generate low values for the first and second clamp control signals 410, 412 during the non-fault regular load operation based on a low value for the fault signal 302. The first inverter 306 obtains and inverts the low value of the first clamp control signal 410 to a high value that turns off MP1 308. The second inverter 402 obtains and inverts the low value of the second clamp control signal 412 to a high value that turns off MP11 404. In response to turning off MP1 308 and MP11 404, the $V_C$ of the $V_{DS}$ clamp 102b during the non-fault regular load operation can be evaluated as approximately 44 V as described above in Equation (1).

In some examples, the controller 130 adjusts $V_C$ of the $V_{DS}$ clamp 102b to a second clamp voltage, or a second threshold, by generating a high value and/or otherwise enabling the first clamp control signal 410 and disabling the second clamp control signal 412 during a first fault condition of the first transistor 124. The first fault condition of the first transistor 124 may correspond to a full thermal shutdown and/or a full utilization of the current limiter monitoring the first transistor 124. The controller 130 can determine the first fault condition of the first transistor 124 based on the fault signal 302. For example, the controller 130 can generate a high value for the first clamp control signal 410 and a low value for the second clamp control signal 412 during the first fault condition. The first inverter 306 obtains and inverts the high value of the first clamp control signal 410 to a low value that turns on the MP1 308. The second inverter 402 obtains and inverts the low value of the second clamp control signal 412 to a high value that turns off MP11 404.

In response to turning on MP1 308 and turning off MP11 404, the $V_C$ of the $V_{DS}$ clamp 102b during the first fault condition can be evaluated as approximately 27 V as described below in Equation (3):

$$V_C = V_{D,MP2} + V_{D3} + V_{D4} + V_{TH1} + V_{TH2} \quad \text{Equation (3)}$$

For example, a current path can be formed through MP1 308 and the body diode 309 of MP2 310 by shunting the first node 332 and the second node 334.

In some examples, the controller 130 adjusts $V_C$ of the $V_{DS}$ clamp 102b to a third clamp voltage, or a third threshold, by disabling the first clamp control signal 410 and enabling the second clamp control signal 412 during a second fault condition of the first transistor 124. The second fault condition of the first transistor 124 may correspond to a partial thermal shutdown and/or a partial utilization of the current limiter monitoring the first transistor 124. The controller 130 can determine the second fault condition of the first transistor 124 based on the fault signal 302. For example, the controller 130 can generate a low value for the first clamp control signal 410 and a high value for the second clamp control signal 412 during the second fault condition. The first inverter 306 obtains and inverts the low value of the first clamp control signal 410 to a high value that turns off MP1 308. The second inverter 402 obtains and inverts the high value of the second clamp control signal 412 to a low value that turns on MP11 404.

In response to turning off MP1 308 and turning on MP11 404, the $V_C$ of the $V_{DS}$ clamp 102b during the second fault condition can be approximated as 33 V as described below in Equation (4):

$$V_C = V_{D,MP22} + V_{D2} + V_{D3} + V_{D4} + V_{TH1} + V_{TH2} \quad \text{Equation (4)}$$

For example, a current path can be formed through MP11 404 and the body diode 405 of MP22 406 by shunting the first node 334 and the third node 408. Alternatively, the example of Equation (4) may be used by turning on MP1 308 and turning on MP11 404 by generating high values for the first and second clamp control signals 410, 412 causing $V_C$ of the $V_{DS}$ clamp 102b to become approximately 27 V.

Figure 5:
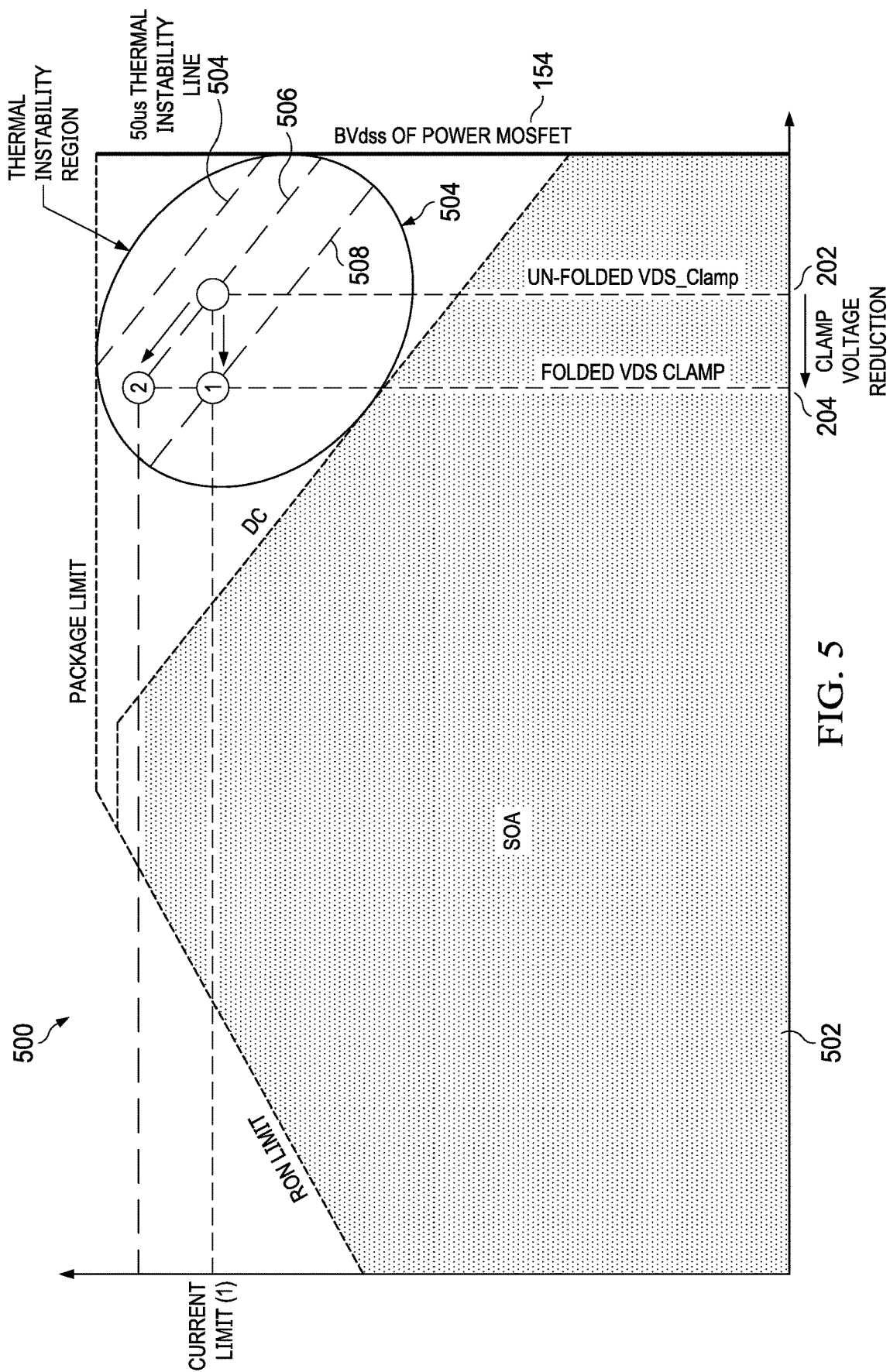
FIG. 5 depicts an example graph corresponding to a safe operating area of the power switching system of FIG. 1.

FIG. 5 depicts an example graph 500 corresponding to an example safe operating area (SOA) 502 of the first transistor 124 of FIG. 1. The SOA 502 corresponds to voltage and current conditions over which the first transistor 124 of FIG. 1 can be expected to operate without self-damage. In FIG. 5, the graph 500 depicts an example thermal instability region 504 corresponding to voltage and current conditions over which the first transistor 124 may be damaged due to operation at such conditions.

Figure 6:
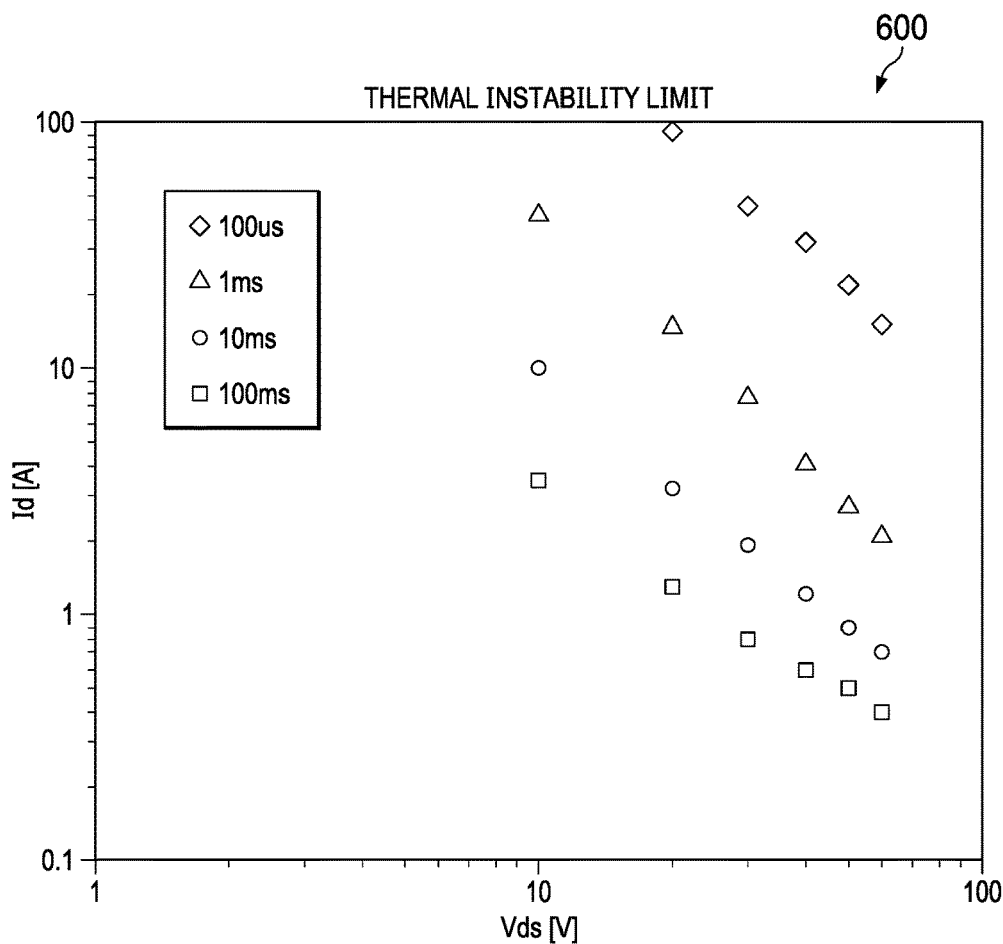
FIG. 6 depicts an example graph corresponding to a thermal instability limit of the power switching system of FIG. 1.

In the illustrated example of FIG. 5, the first transistor 124 is operating on a first example thermal instability line 506 for an example time window. The first thermal instability line 506 is determined based on a quantity of power that can be dissipated for a given time window as described in connection with FIG. 6. FIG. 6 depicts an example thermal instability limit graph 600 as a function of $V_{DS}$ and drain current $I_D$ of the first transistor 124 of FIG. 1. As depicted in FIG. 6, the first transistor 124 can operate at higher $V_{DS}$ and $I_D$ limits with shorter pulse widths of the first transistor 124 being enabled. For example, the first transistor 124 can operate at a higher $V_{DS}$ and $I_D$ limit when the pulse width of the first transistor 124 is 100 microseconds (us) compared to a pulse width of 100 milliseconds (ms). For example, the first transistor 124 can operate at higher limits for the shorter pulse width due to a shorter period of time because less energy will be accumulated on the first transistor 124.

Turning back to FIG. 5, the controller 130 of FIG. 1 can enable the first transistor 124 of FIG. 1 to operate with a higher reliability margin and/or push a higher $I_{DS}$ (e.g., operate a higher $I_{DS}$ current limit) during a peak power dissipation time window. For example, when the first transistor 124 is in a non-fault regular load condition, the controller 130 can direct the $V_{DS}$ clamp 102 of FIG. 1 to adjust to the first voltage threshold 202 of FIG. 2. In response to a fault condition of the first transistor 124, the controller 130 may direct the $V_{DS}$ clamp 102 to adjust to the second voltage threshold 204 of FIG. 2.

In some examples, by reducing the $V_C$ of the $V_{DS}$ clamp 102 from the first voltage threshold 202 (e.g., 44 V) to the second voltage threshold 204 (e.g., 27 V, 33 V, etc.), the controller 130 can enable the first transistor 124 to operate at a higher current limit by staying on the same thermal instability limit line 506 (e.g., by moving from position 1 to position 2 on the graph 500). For example, the first transistor 124 can operate based on a first current limit (e.g., a first current limit of the $I_{DS}$) at a SOA margin when the $V_C$ is the first voltage. In such examples, the controller 130 can direct and/or otherwise enable the first transistor 124 to operate based on a second current limit (e.g., a second current limit of the $I_{DS}$) at the same SOA margin when the $V_C$ is the second voltage, where the second current limit is higher than the first current limit.

In some examples, by reducing the $V_C$ of the $V_{DS}$ clamp 102 from the first voltage threshold 202 (e.g., 44 V) to the second voltage threshold 204 (e.g., 27 V, 33 V, etc.), the controller 130 can enable the first transistor 124 to operate at the same current limit but at a higher SOA margin by moving from the first thermal instability line 506 to a second example thermal instability line 508 (e.g., by moving from position 1 to position 2 on the graph 500). For example, the first transistor 124 can operate based on a current limit (e.g., a current limit of the $I_{DS}$) at a first SOA margin when the $V_C$ is the first voltage. In such examples, the controller 130 can direct and/or otherwise enable the first transistor 124 to operate based on the same current limit at a second SOA margin when the $V_C$ is the second voltage, where the second SOA margin is higher than the first SOA margin.

Figure 7:
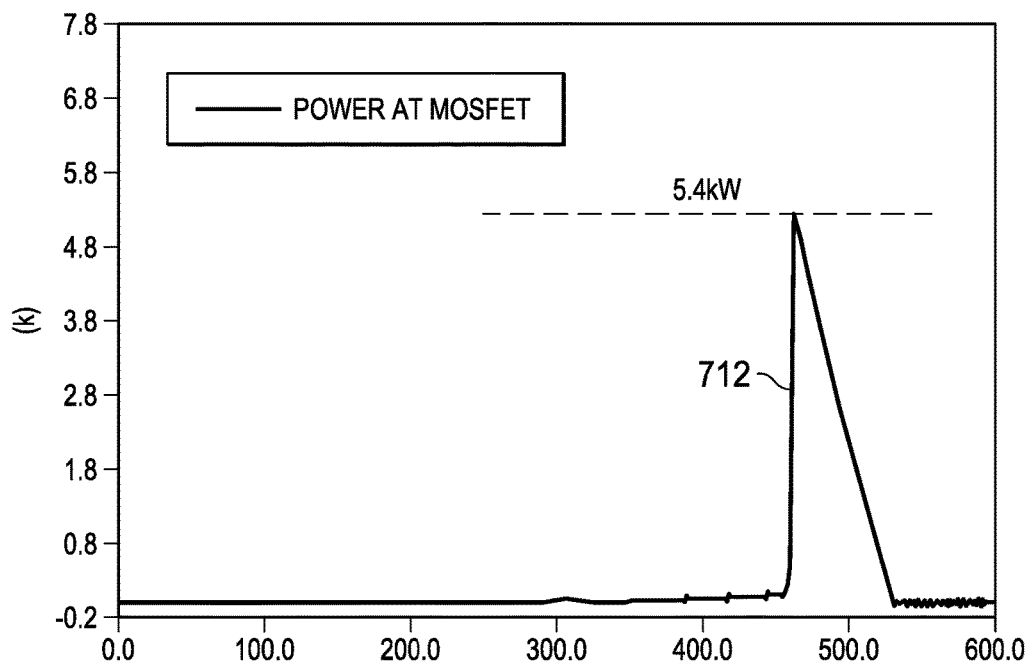
FIG. 7 depicts electrical parameters of the power switching system of FIG. 1 when an example transistor is experiencing a fault condition.
Figure 7:
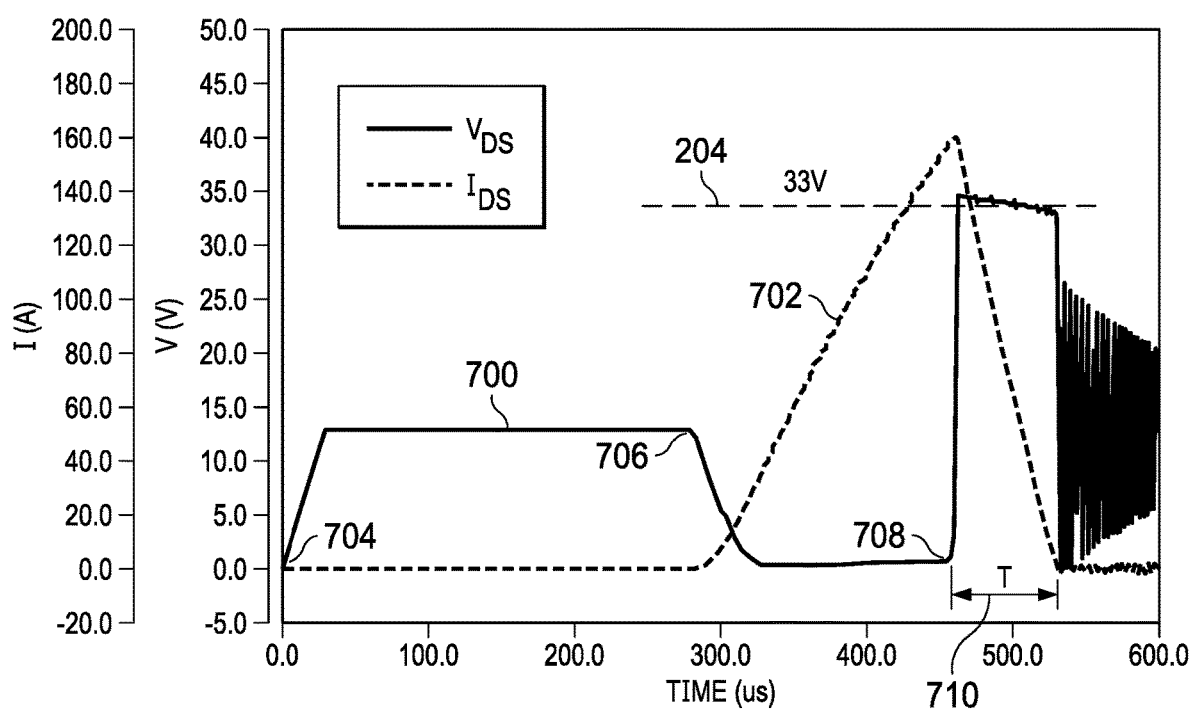

FIG. 7 depicts electrical parameters of the first transistor 124 of FIG. 1 when the first transistor 124 of FIG. 1 is experiencing a fault condition. In FIG. 7, a first example curve 700 depicts $V_{DS}$ of the first transistor 124 of FIG. 1 as a function of time. In FIG. 7, a second example curve 702 depicts $I_{DS}$ of the first transistor 124 as a function of time. At a first time 704 of 0 us, the first transistor 124 is turned off causing $V_{DS}$ to correspond to the supply voltage 126 of FIG. 1 (e.g., approximately 14 V from a vehicle alternator, a vehicle battery, etc.). At a second time 706 of approximately 280 us, the first transistor 124 is turned on causing $V_{DS}$ to approach approximately 0 V and causing $I_{DS}$ to increase. At a third time 708 of approximately 460 us, the first transistor 124 is turned off causing an impedance of the first transistor 124 to increase, the $I_{DS}$ to decrease, and the $V_{DS}$ to increase to the second voltage threshold 204 of FIG. 2.

In FIG. 7, the $V_{DS}$ remains at the second voltage threshold 204 for a fold time r 710 until the $I_{DS}$ reaches approximately 0 A. Further shown in FIG. 7, a third example curve 712 depicts power dissipation of the first transistor 124 as a function of time. At the third time 708, the power dissipation reaches approximately 5.4 kilowatts (kW) and decreases to approximately 0 kW during the fold time 710.

Figure 8:
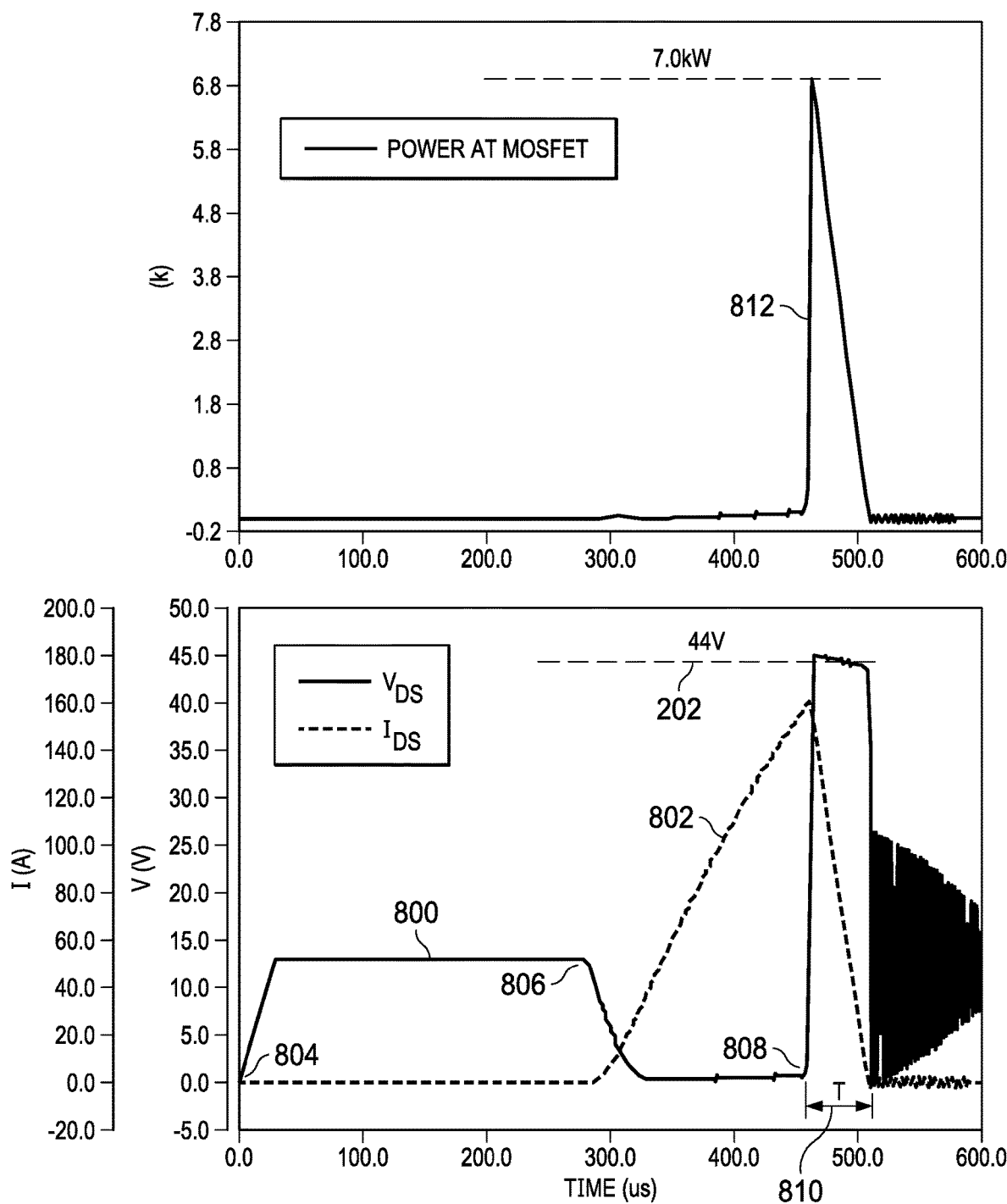
FIG. 8 depicts electrical parameters of the power switching system of FIG. 1 when the example transistor of FIG. 7 is experiencing a non-fault regular load condition.

FIG. 8 depicts electrical parameters of the first transistor 124 of FIG. 1 when the first transistor 124 of FIG. 1 is experiencing a non-fault regular load condition. In FIG. 8, a first example curve 800 depicts $V_{DS}$ of the first transistor 124 of FIG. 1 as a function of time. In FIG. 8, a second example curve 802 depicts $I_{DSS}$ of the first transistor 124 as a function of time. At a first time 804 of 0 us, the first transistor 124 is turned off causing $V_{DS}$ to correspond to the supply voltage 126 of FIG. 1 (e.g., approximately 14 V from a vehicle alternator, a vehicle battery, etc.). At a second time 806 of approximately 280 us, the first transistor 124 is turned on causing $V_{DS}$ to approach approximately 0 V and causing $I_{DS}$ to increase. At a third time 808 of approximately 460 us, the first transistor 124 is turned off causing an impedance of the first transistor 124 to increase, the $I_{DS}$ to decrease, and the $V_{DS}$ to increase to the first voltage threshold 202 of FIG. 2.

In FIG. 8, the $V_{DS}$ remains at the first voltage threshold 202 for a fold time r 810 until the $I_{DS}$ reaches approximately 0 A. Further shown in FIG. 8, a third example curve 812 depicts power dissipation of the first transistor 124 as a function of time. At the third time 808, the power dissipation reaches approximately 7.0 kilowatts (kW) and decreases to approximately 0 kW during the fold time 810.

Figure 9:
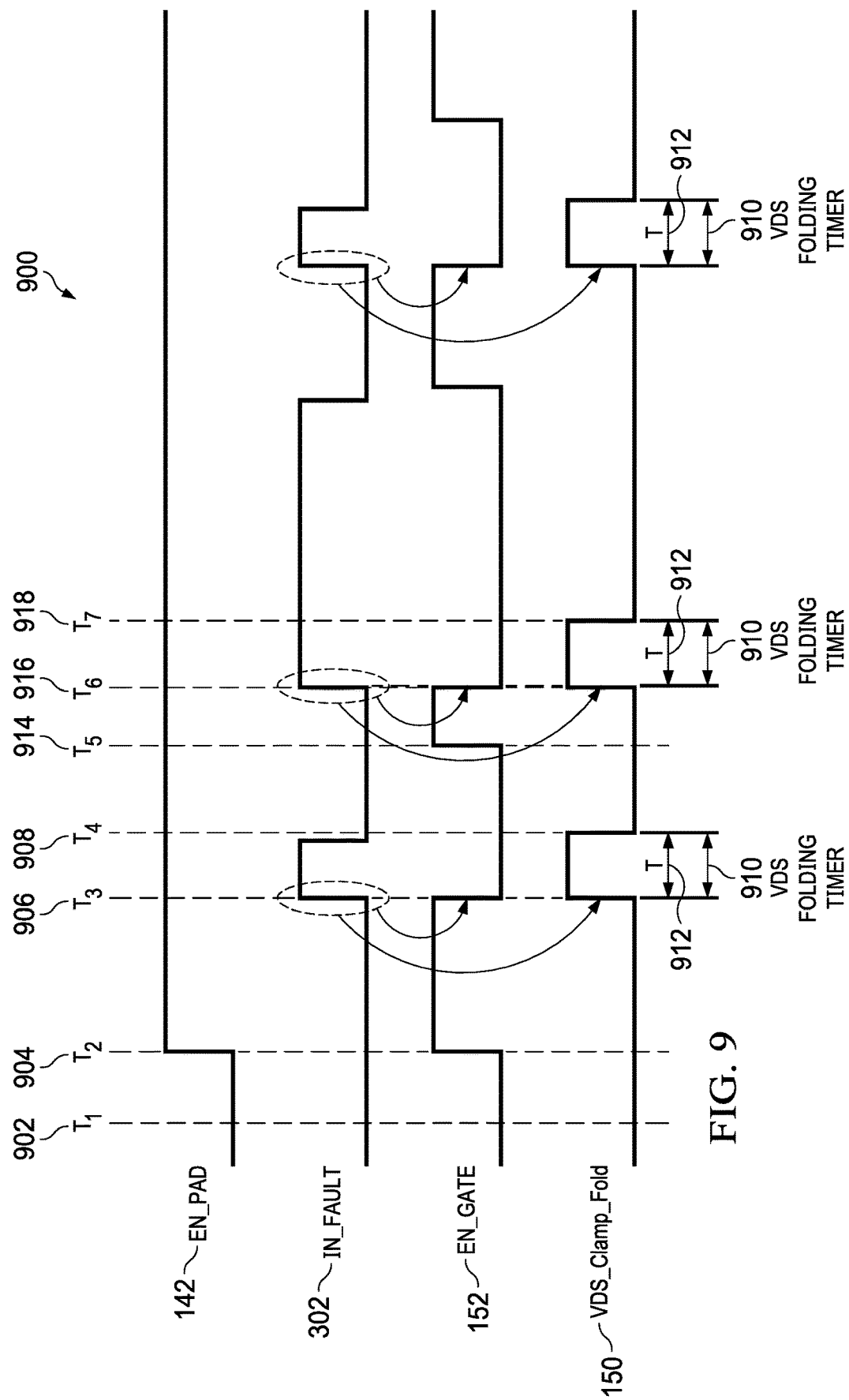
FIG. 9 depicts an example timing diagram corresponding to an operation of the example power switching system of FIG. 1.

FIG. 9 depicts an example timing diagram 900 corresponding to an operation of the $V_{DS}$ clamp 102 of FIG. 1. At a first time ($T_1$) 902, the controller 130 determines that the first transistor 124 of FIG. 1 is in a non-fault regular load condition based on receiving a low value for the fault signal 302 from the fault condition detector 304 of FIG. 3. In response to determining the non-fault regular load condition, the controller 130 generates a low value for the first control signal 150 to adjust the $V_C$ of the $V_{DS}$ clamp 102 of FIG. 1 to the first voltage threshold 202 of FIG. 2 (e.g., 44 V).

In the illustrated example of FIG. 9, at a second time ($T_2$) 904, the controller 130 of FIG. 1 generates high values for the enable signal 142 and the second control signal 152 to turn on the first transistor 124 of FIG. 1. At a third time ($T_3$) 906, the controller 130 receives a high value for the fault signal 302. In response to receiving the high value for the fault signal 302, the controller 130 can determine that the first transistor 124 is in a fault condition (e.g., the first fault condition, the second fault condition, etc.). In response to determining the fault condition of the first transistor 124, the controller 130 generates a low value for the second control signal 152 to turn off the first transistor 124 and generates a high value for the first control signal 150 to adjust the $V_C$ of the $V_{DS}$ clamp 102 to the second voltage threshold 204 of FIG. 2. For example, the controller 130 can turn on MP1 308 of FIG. 3 and shunt the first node 332 to the second node 334 to adjust the $V_C$ of the $V_{DS}$ clamp 102 from 44 V to 33 V.

In FIG. 9, the controller 130 adjusts the $V_C$ of the $V_{DS}$ clamp 102 to the second voltage threshold 204 until a fourth time ($T_4$) 908 for a fold time τ 912 defined by a $V_{DS}$ folding timer 910. In FIG. 9, the controller 130 outputs a high value for the first control signal 150 until the fold time 912 expires. The $V_C$ of the $V_{DS}$ clamp 102 is adjusted from the first voltage threshold 202 to the second voltage threshold 204 until the fourth time 908 at which the $V_C$ is adjusted back to the first voltage threshold 202. The fold time 912 can correspond to the fold time 710 of FIG. 7 or the fold time 810 of FIG. 8. The fold time 912 is defined by the controller 130 to ensure that the $I_{DS}$ of the first transistor 124 approaches approximately 0 A as described above in connection with FIGS. 7 and/or 8 before re-adjusting the $V_C$ of the $V_{DS}$ clamp 102 to the first voltage threshold 202. In FIG. 9, the fold time 912 is the same for each instance of the first transistor 124 experiencing a fault condition. Alternatively, the controller 130 may adjust the fold time 912 to different time values between fault conditions of the first transistor 124.

In the illustrated example of FIG. 9, at a fifth time ($T_5$) 914, the controller 130 resumes normal operation of the first transistor 124 by generating a high value for the second control signal 152 to turn on the first transistor 124. At a sixth time ($T_6$) 916, the controller 130 determines that the first transistor 124 is experiencing a fault condition based on receiving a high value for the fault signal 302. In response to determining the fault condition, the controller 130 outputs a low value for the second control signal 152 to turn off the first transistor 124 and outputs a high value for the first control signal 150 to adjust the $V_C$ of the $V_{DS}$ clamp 102 from the first voltage threshold 202 to the second voltage threshold 204 spanning the fold time 912. In response to the fold time 912 expiring, the controller 130 generates a low value for the first control signal 150 to return the $V_C$ to the first voltage threshold 202, but the first transistor 124 is still experiencing a fault condition. Therefore, the first transistor 124 does not resume normal operation until the fault signal 302 is lowered.

Figure 10:
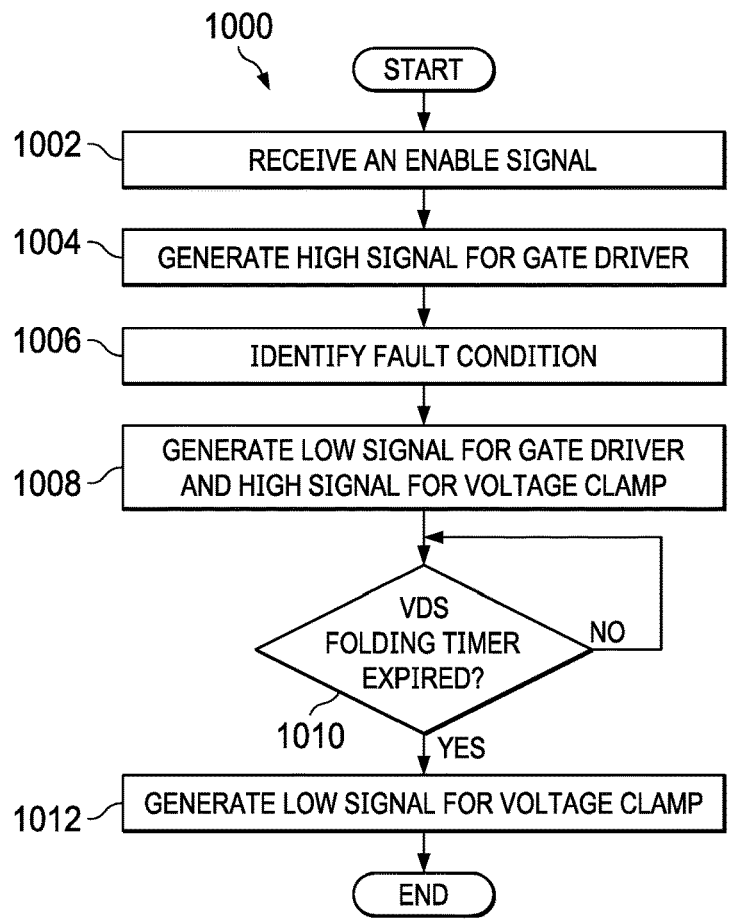
FIG. 10 is a flowchart representative of machine readable instructions which may be executed to implement an example controller to control the example adaptive $V_{DS}$ clamp of FIG. 1.

A flowchart representative of example hardware logic, machine readable instructions, hardware implemented state machines, and/or any combination thereof for implementing the controller 130 of FIGS. 1, 3, and/or 4 is shown in FIG. 10. The machine readable instructions may be an executable program or portion of an executable program for execution by a computer processor such as the processor 1312 shown in the example processor platform 1300 discussed below in connection with FIG. 13. The program may be embodied in software stored on a non-transitory computer readable storage medium such as a CD-ROM, a floppy disk, a hard drive, a DVD, a Blu-ray disk, or a memory associated with the processor 1312, but the entire program and/or parts thereof could alternatively be executed by a device other than the processor 1312 and/or embodied in firmware or dedicated hardware. Further, although the example program is described with reference to the flowchart illustrated in FIG. 10, many other methods of implementing the example controller 130 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example process of FIG. 10 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

FIG. 10 is a flowchart representative of example machine readable instructions 1000 that may be executed to implement the controller 130 of FIGS. 1, 3, and/or 4 to control the $V_{DS}$ clamps 102, 102a, 102b of FIGS. 1, 3, and/or 4. The machine readable instructions 1000 begin at block 1002 when the controller 130 receives an enable signal. For example, the controller 130 can receive the enable signal 142 of FIG. 1 to initialize the power switching system 100 of FIG. 1.

In response to receiving the enable signal, the controller 130 generates a high signal for a gate driver at block 1004. For example, the controller 130 can generate a high value for the second control signal 152 of FIG. 1 to enable the gate-pull up driver 136 of FIG. 1 to switch on the first transistor 124.

At block 1006, the controller 130 identifies a fault condition. For example, the controller 130 can determine that the first transistor 124 of FIG. 1 is experiencing a fault condition based on the fault signal 302 obtained from the fault condition detector 304 of FIG. 3.

At block 1008, the controller 130 generates a low signal for the gate driver and a high signal for a voltage clamp. For example, the controller 130 can generate a low value for the second control signal 152 to disable the gate-pull up driver 136 and to enable the gate-pull down driver 138 of FIG. 1 to switch off the first transistor 124. The controller 130 may generate a high value for the first control signal 150 to turn on MP1 308 to fold the $V_C$ of the $V_{DS}$ clamp 102 from the first voltage threshold 202 (e.g., 44 V) to the second voltage threshold 204 (e.g., 33 V).

At block 1010, the controller 130 determines whether a $V_{DS}$ folding timer has expired. For example, the controller 130 can determine whether the $V_{DS}$ folding timer 910 of FIG. 9 has expired. If, at block 1010, the controller 130 determines that the $V_{DS}$ folding timer has not expired, the controller 130 re-determines whether the $V_{DS}$ folding timer has expired at block 1010. If, at block 1010, the controller 130 determines that the $V_{DS}$ folding timer has expired, then, at block 1012, the controller generates a low signal for the voltage clamp. For example, the controller 130 can generate a low value for the first control signal 150 to turn off MP1 308 to return the $V_C$ of the $V_{DS}$ clamp 102 to the first voltage threshold 202. In response to generating the low signal for the voltage clamp, the machine readable instructions 1000 conclude.

Figure 11:
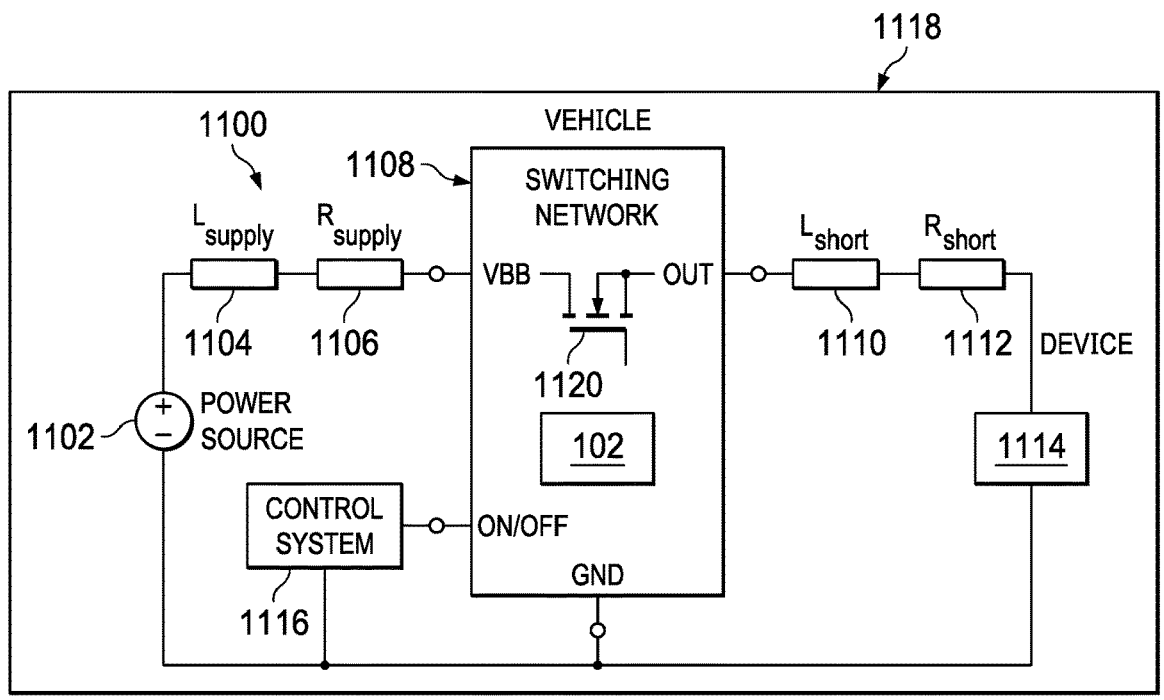
FIG. 11 is a schematic illustration of an example system implementation including the example adaptive $V_{DS}$ clamp of FIG. 1 to implement the examples disclosed herein.

FIG. 11 is a schematic illustration of an example system 1100 including the $V_{DS}$ clamp 102 of FIG. 1 to implement the examples disclosed herein. In FIG. 11, the system 1100 includes an example power source 1102, a first example inductive load ($L_{supply}$) 1104, a first example resistive load ($R_{supply}$) 1106, an example switching network 1108, a second example inductive load ($L_{short}$) 1110, a second example resistive load ($R_{short}$) 1112, an example device 1114, and an example control system 1116.

In the illustrated example of FIG. 11, the system 1100 is an example power switching system included in an example vehicle 1118. In FIG. 11, the vehicle 1118 is an automobile. Alternatively, the vehicle 1118 may be a marine vehicle (e.g., a boat, submarine, etc.), an aircraft (e.g., an unmanned aerial vehicle (UAV) (e.g., a drone), an airplane, etc.), etc. For example, the system 1100 may correspond to the power switching system 100 of FIG. 1. The system 1100 is operative to monitor a condition (e.g., an operating condition) of at least one of the power source 1102 or the device 1114 and control the $V_{DS}$ clamp 102 via the control system 1116 based on the monitoring.

In FIG. 11, the power source 1102 is a battery. For example, the power source 1102 may correspond to the power source 108 of FIG. 1. The first inductive load 1104 and the first resistive load 1106 of FIG. 11 are discrete, physical elements. Alternatively, the first inductive load 1104 and/or the first resistive load 1106 may be representations of an equivalent inductance and resistance of the coupling between the power source 1102 and the switching network 1108. For example, the first inductive load 1104 may correspond to the second inductor 118 of FIG. 1 and/or the first resistive load 1106 may correspond to the first resistor 116 of FIG. 1.

The second inductive load 1110 and the second resistive load 1112 of FIG. 11 are discrete, physical elements (e.g., electrical devices that can be represented by an inductive and/or a resistive load). Alternatively, the second inductive load 1110 and/or the second resistive load 1112 may be representations of an equivalent inductance and resistance of the coupling between the switching network 1108 and the device 1114. For example, the second inductive load 1110 may correspond to the first inductor 114 of FIG. 1 and/or the second resistive load 1112 may correspond to the first resistor 116 of FIG. 1. Additionally or alternatively, the system 1100 may include fewer than or more than the inductive loads 1104, 1110 and/or the resistive loads 1106, 1112 depicted in FIG. 11.

In the illustrated example of FIG. 11, the control system 1116 directs, instructs, and/or otherwise controls the switching network 1108 of FIG. 11. The control system 1116 includes one or more controllers such as the controller 130 of FIG. 1. Alternatively, the control system 1116 may correspond to one or more instances of the controller 130 of FIG. 1. The control system 1116 of FIG. 11 obtains a condition of the device 1114 and generates a control signal based on the condition. For example, the condition may be a non-fault regular load condition (e.g., normal operation, typical operation, standard operation, etc.) or a fault condition.

The control system 1116 of FIG. 11 controls the switching network 1108 based on a condition of the device 1114. In FIG. 11, the switching network 1108 includes an example transistor 1120 (e.g., an N-channel MOSFET, a P-channel MOSFET, etc.). Alternatively, the switching network 1108 may include more than one transistor and/or more than one type of transistor. In FIG. 11, the transistor 1120 is coupled either directly to or through one or more intervening electrical devices to the $V_{DS}$ clamp 102 of FIG. 1. In FIG. 11, the $V_{DS}$ clamp 102 may also be the $V_{DS}$ clamp 102a of FIG. 3 or the $V_{DS}$ clamp 102b of FIG. 4.

In some examples, the control system 1116 of FIG. 11 generates a control signal (e.g., the first control signal 150 of FIG. 1, the second control signal 152 of FIG. 1, etc.) to adjust the $V_{DS}$ clamp 102 from a first voltage to a second voltage based on the condition of the device 1114. For example, the control system 1116 may instruct the $V_{DS}$ clamp 102 to adjust or fold back from a first voltage clamp level of 44 V during a non-fault regular load operation of the device 1114 to a second voltage clamp level of 33 V in response to determining that the device 1114 is experiencing a fault condition. The control system 1116 of FIG. 11 generates (e.g., iteratively generates, continuously generates, etc.) the control signal for a time period defined by a $V_{DS}$ folding timer. In response to an expiration of the $V_{DS}$ folding timer, the control system 1116 generates another control signal to direct the $V_{DS}$ clamp 102 to adjust from the second voltage clamp level of 33 V back to the first voltage clamp level of 44 V.

In some examples, the $V_{DS}$ clamp 102 clamps the $V_{DS}$ of the transistor 1120 included in the switching network 1108 when a supply voltage ($V_{BB}$) from the power source 1102 exceeds a voltage clamp level. For example, the $V_{DS}$ clamp 102 during a non-fault regular load operation of the device 1114 may have a voltage clamp level of 44 V. In such examples, the $V_{DS}$ clamp 102 may clamp a supply voltage of 50 V to 44 V when the device 1114 is not experiencing a fault condition. For example, the $V_{DS}$ clamp 102 may clamp the supply voltage to a first voltage (e.g., 44 V) during a non-fault regular load operation of the device 1114 and clamp the supply voltage to a second voltage (e.g., 33 V) during a fault condition of the device 1114. The system 1100 of FIG. 11 supplies the necessary power and/or otherwise facilitates an operation of the device 1114 when the device 1114 is experiencing different operating conditions due to the adaptive nature of the $V_{DS}$ clamp 102 (e.g., the $V_{DS}$ clamp 102a of FIG. 3, the $V_{DS}$ clamp 102b of FIG. 4, etc.).

Figure 12:
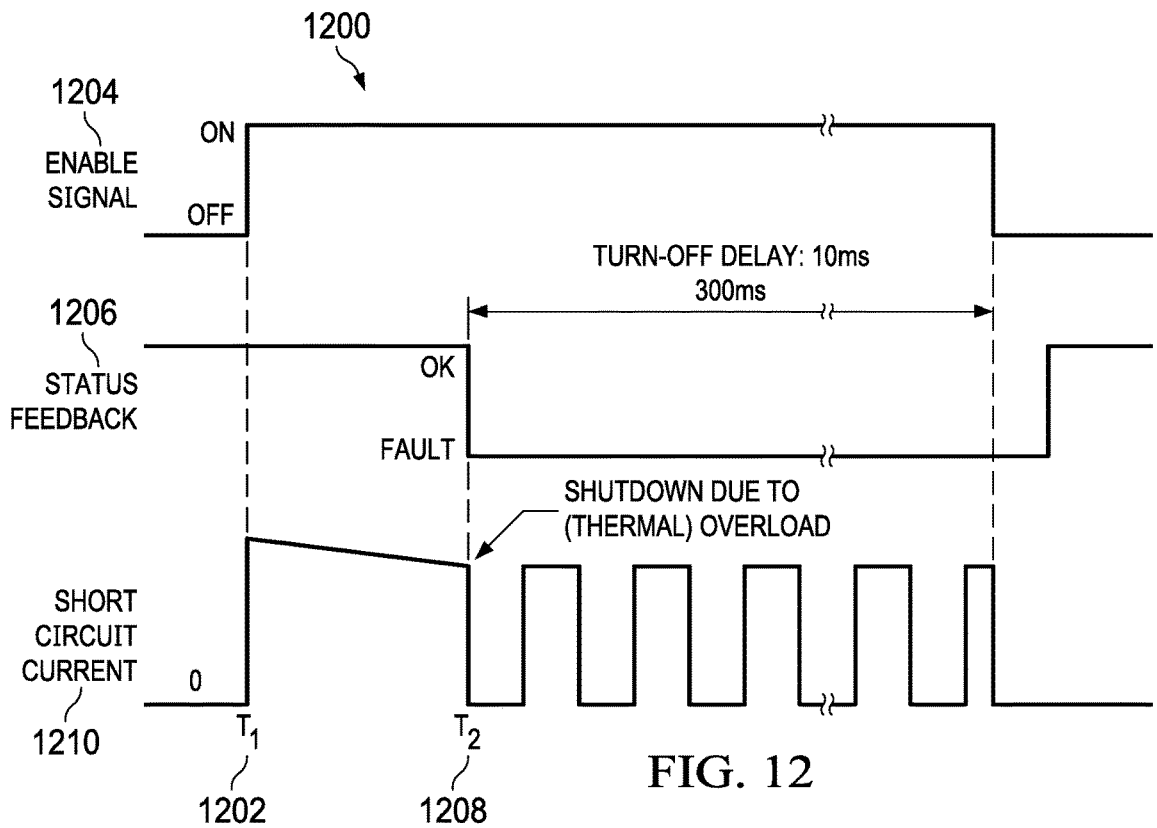
FIG. 12 depicts an example timing diagram corresponding to an operation of the example system of FIG. 11.

FIG. 12 depicts an example timing diagram 1200 corresponding to an operation of the system 1100 of FIG. 11. In FIG. 12, at a first time ($T_1$) 1202, the control system 1116 of FIG. 11 receives a high value for an example control signal 1204. For example, the control signal 1204 may correspond to the enable signal 142 of FIG. 1. In response to receiving a high value for the control signal 1204, the control system 1116 may instruct a controller (e.g., the controller 130 of FIG. 1) to initialize the system 1100 of FIG. 11. At the first time 1202, the control system 1116 receives an example status feedback signal 1206. For example, the status feedback signal 1206 may correspond to the fault signal 302 of FIG. 3. For example, the status feedback signal 1206 may indicate a condition of the device 1114 of FIG. 11. At the first time 1202, the control system 1116 determines that the status feedback signal 1206 indicates that the device 1114 is in a non-fault regular load condition.

In the illustrated example of FIG. 12, at a second time ($T_2$) 1208, the device 1114 of FIG. 11 is experiencing a fault condition evident by an increase in an example short circuit current 1210. At the second time 1208, the increase in the short circuit current 1210 causes the status feedback signal 1206 to change from a first voltage to a second voltage indicating that the device 1114 is experiencing a fault condition. At the second time 1208, the control system 1116 determines that the device 1114 is in a fault condition based on the status feedback signal 1206. In response to determining that the device 1114 is in the fault condition, the control system 1116 generates a control signal to adjust the $V_{DS}$ clamp 102 included in the switching network 1108 of FIG. 11 from a first clamp voltage to a second clamp voltage for a time period defined by a $V_{DS}$ folding timer.

Figure 13:
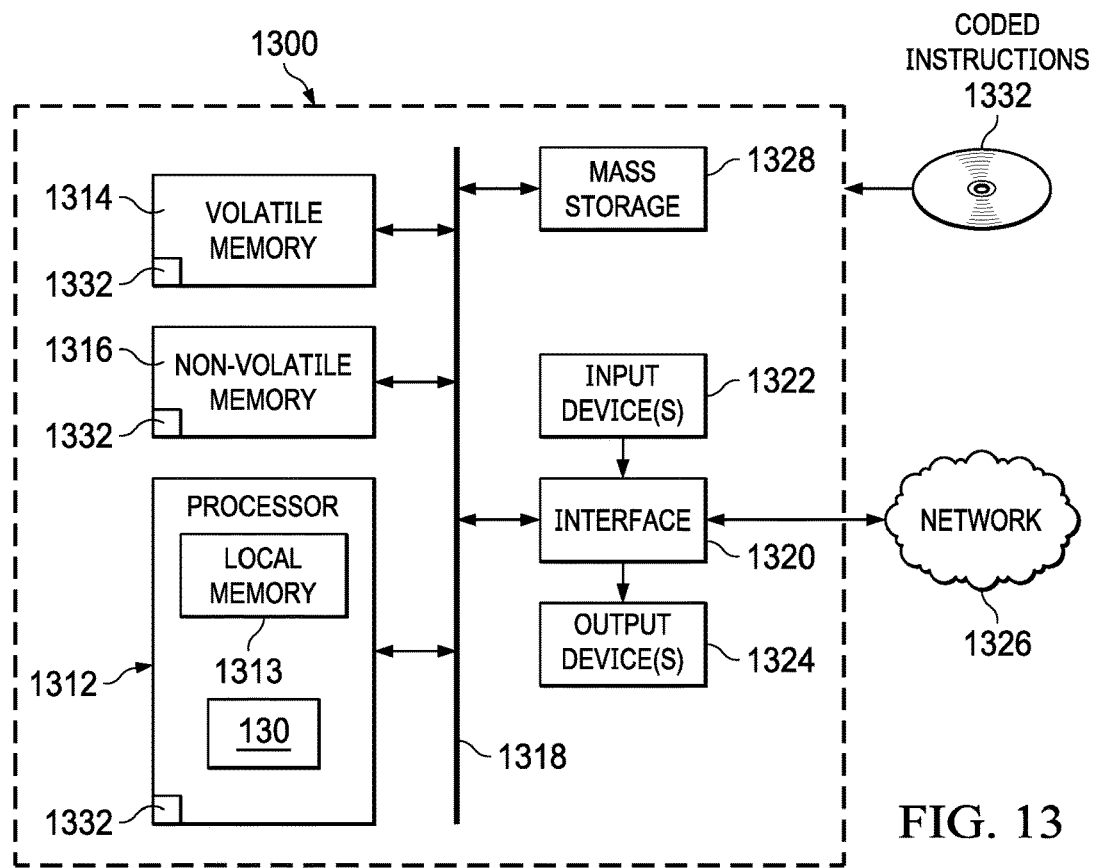
FIG. 13 is a block diagram of an example processing platform structured to execute the instructions of FIG. 10 to implement the example controller.

FIG. 13 is a block diagram of an example processor platform 1300 structured to execute the instructions of FIG. 10 to implement the controller 130 of FIGS. 1, 3 and/or 4. The processor platform 1300 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1300 of the illustrated example includes a processor 1312. The processor 1312 of the illustrated example is hardware. For example, the processor 1312 can be implemented by one or more integrated circuits, logic circuits, microprocessors, GPUs, DSPs, or controllers from any desired family or manufacturer. The hardware processor may be a semiconductor based (e.g., silicon based) device. In this example, the processor 1312 implements the controller 130.

The processor 1312 of the illustrated example includes a local memory 1313 (e.g., a cache). The processor 1312 of the illustrated example is in communication with a main memory including a volatile memory 1314 and a non-volatile memory 1316 via a bus 1318. The volatile memory 1314 may be implemented by Synchronous Dynamic Random Access Memory (SDRAM), Dynamic Random Access Memory (DRAM), RAMBUS® Dynamic Random Access Memory (RDRAM®), and/or any other type of random access memory device. The non-volatile memory 1316 may be implemented by flash memory and/or any other desired type of memory device. Access to the main memory 1314, 1316 is controlled by a memory controller.

The processor platform 1300 of the illustrated example also includes an interface circuit 1320. The interface circuit 1320 may be implemented by any type of interface standard, such as an Ethernet interface, a universal serial bus (USB), a Bluetooth® interface, a near field communication (NFC) interface, and/or a PCI express interface.

In the illustrated example, one or more input devices 1322 are connected to the interface circuit 1320. The input device(s) 1322 permit(s) a user to enter data and/or commands into the processor 1312. The input device(s) 1322 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1324 are also connected to the interface circuit 1320 of the illustrated example. The output devices 1324 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer, and/or speaker. The interface circuit 1320 of the illustrated example, thus, typically includes a graphics driver card, a graphics driver chip, and/or a graphics driver processor.

The interface circuit 1320 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1326. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1300 of the illustrated example also includes one or more mass storage devices 1328 for storing software and/or data. Examples of such mass storage devices 1328 include floppy disk drives, hard drive disks, compact disk drives, Blu-ray disk drives, redundant array of independent disks (RAID) systems, and digital versatile disk (DVD) drives.

The machine executable instructions 1332 of FIG. 10 may be stored in the mass storage device 1328, in the volatile memory 1314, in the non-volatile memory 1316, and/or on a removable non-transitory computer readable storage medium such as a CD or DVD.

From the foregoing, it will be appreciated that example methods, apparatus, and articles of manufacture have been disclosed that provide a dynamic adjustment on drain-source voltage clamp levels. Such a dynamic adjustment improves a versatility of a power-switchable device under load dump and more robust under fault conditions without any significant silicon area impact. By adaptively adjusting the drain-source voltage clamp levels, above-disclosed examples can enable the power-switchable device to operate with an increased safe operating area margin at the same current limit or operate at a higher current limit for the same safe operating area margin.

Although certain example methods, apparatus, and articles of manufacture have been disclosed herein, the scope of coverage of this patent is not limited thereto. On the contrary, this patent covers all methods, apparatus, and articles of manufacture fairly falling within the scope of the claims of this patent.

What is claimed is:

1. An apparatus, comprising:
   a controller configured to:
      receive a fault signal; and
      generate at least one control signal responsive to the fault signal;
   a voltage clamp circuit coupled to the controller, the voltage clamp circuit configured to:
      receive the at least one control signal;
      in response to determining that the at least one control signal has a first value, set a clamp voltage to a first voltage value; and
      in response to determining that the at least one control signal has a second value, set the clamp voltage to a second voltage value.

2. The apparatus of claim 1, further comprising a fault condition detector configured to generate the fault signal.

3. The apparatus of claim 1, the voltage clamp circuit comprising a first transistor and a second transistor coupled to the first transistor in a back-to-back diode configuration.

4. The apparatus of claim 3, wherein the voltage clamp circuit comprises an inverter coupled to the second transistor, the inverter configured to invert a control signal of the at least one control signal to switch on the second transistor.

5. The apparatus of claim 4, wherein the control signal is a first control signal, wherein:
   the controller is further configured to generate a second control signal of the at least one control signal based on the fault signal; and
   the voltage clamp circuit is further configured to set the clamp voltage to a third voltage based on the second control signal.

6. The apparatus of claim 5, wherein the inverter is a first inverter, the voltage clamp circuit further comprising a third transistor, a fourth transistor, and a second inverter coupled to the controller and to the third transistor, the third transistor coupled to the fourth transistor, the inverter configured to invert the second control signal to switch on the third transistor.

7. The apparatus of claim 6, wherein at least one of the first transistor, the second transistor, the third transistor, or the fourth transistor is a P-channel metal oxide semiconductor field effect transistor.

8. The apparatus of claim 3, wherein the voltage clamp circuit further comprises a fourth transistor and a third transistor coupled to the fourth transistor in a back-to-back diode configuration.

9. The apparatus of claim 8, further comprising a diode stack coupled to the third transistor and to the fourth transistor, the diode stack comprising two or more diodes.

10. The apparatus of claim 8, wherein the third transistor and the fourth transistor are N-channel metal oxide semiconductor field effect transistors.

11. The apparatus of claim 1, further comprising a gate driver comprising:
    a gate-pull up driver configured to switch on a transistor to provide a supply voltage to a device; and
    a gate-pull down driver configured to switch off the transistor.

12. The apparatus of claim 11, wherein the at least one control signal comprises a first control signal and a second control signal, wherein the controller is further configured to generate the second control signal to enable the gate-pull up driver or the gate-pull down driver.

13. A system, comprising:
    a transistor configured to generate a voltage based on a clamp voltage;
    a controller configured to:
       receive a fault signal; and
       generate at least one control signal responsive to the fault signal; and
    a voltage clamp circuit coupled to the controller and to the transistor, the voltage clamp circuit configured to:
       receive the at least one control signal; and
       in response to determining that the at least one control signal has a first value, set the clamp voltage to a first voltage value; and
       in response to determining that the at least one control signal has a second value, set the clamp voltage to a second voltage value.

14. The system of claim 13, wherein the transistor is configured to operate with a first current limit at a safe operating area margin when the clamp voltage has the first voltage value, and wherein the transistor configured to operate with a second current limit higher than the first current limit at the safe operating area margin when the clamp voltage has the second voltage value.

15. The system of claim 13, wherein the transistor is configured to operate with a current limit at a first safe operating area margin when the clamp voltage has the first voltage value, and the transistor is configured to operate with the current limit at a second safe operating area margin higher than the first safe operating area margin when the clamp voltage has the second voltage value.

16. The system of claim 13, further comprising:
    a fault condition detector configured to generate the fault signal based on a condition of the transistor.

17. The system of claim 13, wherein the transistor is a first transistor, the voltage clamp circuit comprising a second transistor and a third transistor, the voltage clamp circuit configured to clamp a drain-to-source voltage of the first transistor to the second voltage value by controlling the first transistor and the third transistor.

18. A circuit comprising:
    a first transistor having a first source, a first drain, a first gate, and a first body, the first source configured to receive a supply voltage, the first gate configured to receive at least one control signal, the first source coupled to the first body, and the first body coupled to the first drain through a first body diode; and
    a second transistor having a second source, a second drain, a second gate, and a second body, the second drain coupled to the first drain, the second gate coupled to the second source, and the second gate coupled to the second body.

19. The circuit of claim 18, further comprising:
    an inverter coupled to the first gate;
    a series connected diode stack coupled to the second transistor;
    a third transistor coupled to the diode stack and to the first source; and
    a fourth transistor coupled to the second source and to the diode stack.

20. The circuit of claim 18, further comprising:
a resistor having a first terminal and a second terminal, the first terminal coupled to the second source; and
a gate driver coupled to the first terminal and to the second terminal.

* * * * *